(12) United States Patent
Wan

(10) Patent No.: US 12,119,666 B2
(45) Date of Patent: Oct. 15, 2024

(54) POWER MATCHING METHOD AND APPARATUS FOR WIRELESS CHARGING, AND WIRELESS CHARGING APPARATUS

(71) Applicant: GUANGDONG OPPO MOBILE TELECOMMUNICATIONS CORP., LTD., Guangdong (CN)

(72) Inventor: Shiming Wan, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 543 days.

(21) Appl. No.: 17/498,669

(22) Filed: Oct. 11, 2021

(65) Prior Publication Data

US 2022/0029461 A1 Jan. 27, 2022

Related U.S. Application Data

(63) Continuation of application No. PCT/CN2019/084857, filed on Apr. 28, 2019.

(51) Int. Cl.
*H02J 50/80* (2016.01)
*H02J 50/12* (2016.01)
*H03H 7/38* (2006.01)

(52) U.S. Cl.
CPC .............. *H02J 50/12* (2016.02); *H02J 50/80* (2016.02); *H03H 7/38* (2013.01); *H03H 2210/025* (2013.01); *H03H 2210/026* (2013.01)

(58) Field of Classification Search
CPC ............. H02J 50/12; H02J 50/80; H03H 7/38
See application file for complete search history.

(56) References Cited

U.S. PATENT DOCUMENTS 9,991,748 B2 6/2018 Yamamoto et al.
2017/0005532 A1* 1/2017 Akuzawa ................ H02J 50/05
2017/0025899 A1 1/2017 Misawa

FOREIGN PATENT DOCUMENTS

CN 103457362 A 12/2013
CN 103595262 A 2/2014
(Continued)

OTHER PUBLICATIONS

Extended European Search Report for EP Application 19927051.3 mailed Mar. 28, 2022. (7 pages).
(Continued)

*Primary Examiner* — Robert Grant
(74) *Attorney, Agent, or Firm* — Young Basile Hanlon & MacFarlane, P.C.

(57) ABSTRACT

Disclosed are a power matching method and apparatus for wireless charging, and a wireless charging apparatus. The method includes receiving first sensing information sensed from a transmitting coil of the wireless transmitter, wherein the transmitting coil includes at least one of a capacitor assembly with adjustable capacitance and an inductor assembly with adjustable inductance; detecting whether resonant frequency has changed according to the first sensing information; and adjusting at least one of capacitance of the capacitor assembly in the transmitting coil of the wireless transmitter and inductance of the inductor assembly in the transmitting coil in response to the resonant frequency changing to make transmitting power of the wireless transmitter be matched with receiving power of a wireless receiver in the wireless charging system, wherein the first sensing information comprises at least one of a first sensing voltage value and a first sensing current value.

17 Claims, 7 Drawing Sheets

(56) References Cited

FOREIGN PATENT DOCUMENTS

| | | | |
|---|---|---|---|
| CN | 103944277 A | 7/2014 |
| CN | 104158269 A | 11/2014 |
| CN | 104218640 A | 12/2014 |
| CN | 104638774 A | 5/2015 |
| CN | 105229896 A | 1/2016 |
| CN | 105914903 A | 8/2016 |
| CN | 107104516 A | 8/2017 |
| CN | 107124043 A | 9/2017 |
| CN | 108282030 A | 7/2018 |
| JP | H0795271 A | 4/1995 |

OTHER PUBLICATIONS

Chinese First Office Action with English Translation for CN Application 201980093388.5 mailed Aug. 17, 2023. (23 pages).
International search report with English Translation for International Application No. PCT/CN2019/084857 mailed Feb. 3, 2020 (15 pages).
Communication pursuant to Article 94(3) EPC for EP Application 19927051.3 mailed Dec. 9, 2022. (5 pages).
Chinese Second Office Action with English translation for Chinese Application No. 201980093388.5, mailed Jun. 1, 2024, 20 pages.

\* cited by examiner

POWER MATCHING METHOD AND APPARATUS FOR WIRELESS CHARGING, AND WIRELESS CHARGING APPARATUS

CROSS-REFERENCE TO RELATED APPLICATION(S)

The present disclosure is a continuation-application of International (PCT) Patent Application No. PCT/CN2019/084857 filed Apr. 28, 2019, the entire contents of all of which are hereby incorporated by reference.

TECHNICAL FIELD

The present disclosure relates to the field of wireless charging technologies, and in particular, to a power matching method and an apparatus for wireless charging and a wireless charging apparatus.

BACKGROUND

According to different wireless charging principles, wireless charging methods are mainly divided into three modes, such as magnetic coupling (or electromagnetic induction), magnetic resonance and radio wave. At present, mainstream wireless charging standards include QI standards, power matters Alliance (PMA) standards and Alliance for wireless power (A4WP) standards. The QI standards and the PMA standards adopt the magnetic coupling for wireless charging. The A4WP standards use magnetic resonance for wireless charging.

A most common electromagnetic induction wireless charging technology mainly adopts an electromagnetic wave induction principle and a related AC induction technology. At a transmitter, alternating current (AC) signals of a certain frequency are converted into electromagnetic signals through a transmitting coil, and at a receiver, the electromagnetic signals sent by the transmitter are converted into AC electrical signals through a receiving coil for charging.

A basic principle of the electromagnetic induction wireless charging technology is shown in FIG. 1. An AC power supply SAC and inductance capacitance resonance circuit (L1, C1) are on a side of a primary coil (a wireless transmitter). RS is a battery internal resistance of the AC power supply SAC. A load RL and another inductance capacitance resonant circuit (L2, C2) are on a side of a secondary coil (a wireless receiver). Mutual inductance coil are represented by inductors L1 and L2, and a turn ratio between L1 and L2 is K1:K2. The turn ratio determines the amount of an output AC.

In the QI standard using the electromagnetic induction wireless charging technology, a resonant frequency F of a coil is specified to be about 110 KHZ. Thus, it can be obtained that a relationship between inductance and capacitance at the transmitter and receiver is that $1/\text{sqrt}(L1*C1) = 1/\text{sqrt}(L2*C2) = F$.

However, due to influence of parasitic inductance capacitance and load in circuits and different charging positions, there is a slight change between actual resonant frequency and ideal resonant frequency. In addition, a coupling coefficient between the transmitting coil and the receiving coil will be determined by distance, position, dielectric material and other factors therebetween, and is usually between 0.2 and 0.7. Therefore, in existing wireless charging schemes, there will be defects such as low charging efficiency and easy heating.

Information disclosed above in the background is only used to enhance understanding of the background of the disclosure and may include information that does not constitute prior art known to those of ordinary skill in the art.

SUMMARY

In view of above, the present disclosure provides a power matching method and an apparatus for wireless charging and a wireless charging apparatus.

Other features and advantages of the present disclosure will become apparent through the following detailed description, or will be partly learned through practice of the present disclosure.

In one aspect of the present disclosure, a power matching apparatus for wireless charging for a wireless transmitter is provided. The power matching apparatus for wireless charging includes a transmitting coil and a controller electrically connected with the transmitting coil. The transmitting coil includes at least one of a capacitor assembly with adjustable capacitance and an inductor assembly with adjustable inductance. The controller electrically is configured to receive first sensing information sensed from the transmitting coil, detect whether resonant frequency has changed according to the first sensing information, and adjust at least one of capacitance of the capacitor assembly and inductance of the inductor assembly to make transmitting power of the wireless transmitter be matched with receiving power of the wireless receiver in response to the resonant frequency being changed, wherein the first sensing information comprises a first sensing voltage value or a first sensing current value.

In another aspect of the present disclosure, a power matching method for wireless charging for the wireless transmitter in the wireless charging system is provided. The method includes: receiving first sensing information sensed from the transmitting coil; detecting whether resonant frequency has changed according to the first sensing information; and adjusting at least one of capacitance of the capacitor assembly in the transmitting coil of the wireless transmitter and adjusting inductance of the inductor assembly in the transmitting coil in response to the resonant frequency changing to make transmitting power of the wireless transmitter be matched with receiving power of a wireless receiver in the wireless charging system; wherein the first sensing information includes at least one of a first sensing voltage value and a first sensing current value.

In another aspect of the present disclosure, a wireless charging apparatus is provided. The wireless charging apparatus includes a power matching apparatus for wireless charging. The power matching apparatus for wireless charging is for a wireless transmitter and includes a transmitting coil and a controller electrically connected with the transmitting coil. The transmitting coil includes at least one of a capacitor assembly with adjustable capacitance and an inductor assembly with adjustable inductance. The controller electrically is configured to receive first sensing information sensed from the transmitting coil, detect whether resonant frequency has changed according to the first sensing information, and adjust at least one of capacitance of the capacitor assembly and inductance of the inductor assembly to make transmitting power of the wireless transmitter be matched with receiving power of the wireless receiver in response to the resonant frequency being changed, wherein the first sensing information comprises a first sensing voltage value or a first sensing current value.

BRIEF DESCRIPTION OF DRAWINGS

The above and other objects, features and advantages of the present disclosure will become more apparent by describing exemplary embodiments in detail with reference to the drawings.

Figure 1:
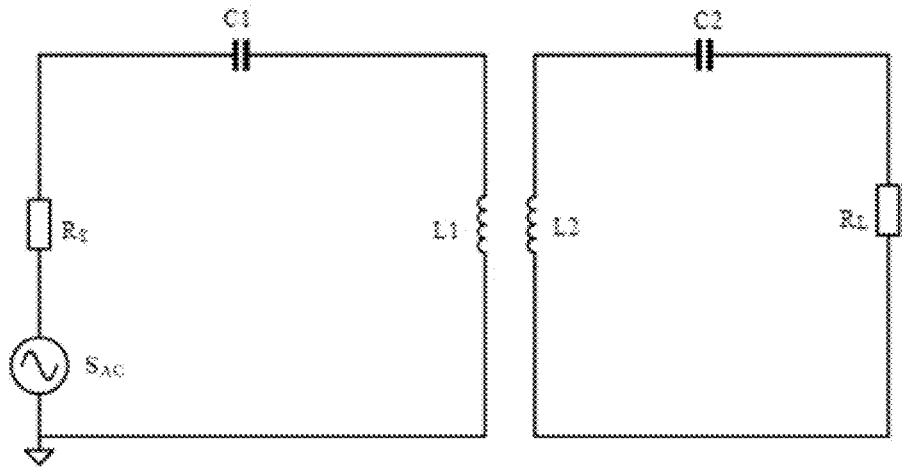
FIG. 1 shows a schematic diagram of an existing wireless charging system provided by some embodiments.

It should be understood that the above general description and the detailed description below are only exemplary and do not limit the present disclosure.

DETAILED DESCRIPTION

Embodiments will now be described more fully with reference to the drawings. However, the exemplary embodiments can be implemented in a variety of forms and should not be construed as being limited to examples set forth herein. On the contrary, these exemplary embodiments are provided to make the present disclosure more comprehensive and complete, and fully convey the concept of the exemplary embodiments to those skilled in the art. The drawings are only schematic diagrams of the present disclosure and are not necessarily drawn to scale. Same reference numerals in figures represent the same or similar parts, so repeated description about them will be omitted.

In addition, described features, structures or characteristics may be combined in one or more embodiments in any suitable manner. In the following description, many specific details are provided to give a full understanding of the embodiments of the present disclosure. However, those skilled in the art will realize that the technical scheme of the present disclosure can be practiced without omitting one or more of the specific details, or by using other methods, components, apparatuses, steps, and the like. In other cases, well-known structures, methods, apparatuses, implementations, or operations are not shown or described in detail to avoid confusing aspects of the present disclosure.

In the present disclosure, unless otherwise expressly specified and limited, the terms "connection", "joining" and other terms shall be understood in a broad sense, for example, it can be an electrical connection or a communication connection, a direct connection or an indirect connection. For those skilled in the art, the specific meaning of the above terms in the present disclosure can be understood according to specific circumstances.

In addition, in the description of the present disclosure, the terms "multiple" or "a plurality of" means at least two, such as two, three, etc., unless otherwise expressly and specifically defined. The term "and/or" describes the association relationship of the associated objects, indicating that there can be three relationships. For example, A and/or B, can indicate the presence of A alone, B alone and both A and B at the same time. The symbol "/" generally indicates that the front and rear associated objects are an "or" relationship. The terms "first" and "second" are used for descriptive purposes only, and are not intended to indicate or imply a relative importance or implicitly indicating the number of technical features indicated. Thus, features defining "first" or "second" may include one or more of the described features either explicitly or implicitly.

In some embodiments, a power matching apparatus for wireless charging for a wireless transmitter is provided. The power matching apparatus for wireless charging includes a transmitting coil and a controller electrically connected with the transmitting coil. The transmitting coil includes at least one of a capacitor assembly with adjustable capacitance and an inductor assembly with adjustable inductance. The controller electrically is configured to receive first sensing information sensed from the transmitting coil, detect whether resonant frequency has changed according to the first sensing information, and adjust at least one of capacitance of the capacitor assembly and inductance of the inductor assembly to make transmitting power of the wireless transmitter be matched with receiving power of the wireless receiver in response to the resonant frequency being changed, wherein the first sensing information comprises a first sensing voltage value or a first sensing current value.

Alternatively, the inductor assembly with adjustable inductance comprises at least one inductance branch. All inductance branches are connected in series with each other in response to the number of the at least one inductance branch being more than one. Each inductance branch comprises an inductor and a switch connected in parallel with the inductor.

Alternatively, the capacitor assembly with adjustable capacitance comprises at least one first capacitance branch and/or at least one second capacitance branch. The at least one first capacitance branch is connected in series with the at least one second capacitance branch in response to the capacitor assembly comprising the at least one first capacitance branch and the at least one second capacitance branch. All first capacitance branches are connected in parallel with each other, and all second capacitance branches are connected in parallel with each other, and each of the at least one of first capacitance branch and the at least one of second capacitance branch includes a capacitor and a switch connected in series with the capacitor.

Alternatively, the controller is configured to determine whether the first sensing information is less than a preset feedback information threshold, and determine that the resonant frequency has changed in response to the first sensing information being less than the preset feedback information threshold, the preset feedback information threshold is a voltage threshold in response to the first sensing information being the first sensing voltage value, and the preset feedback information threshold is a current threshold in response to the first sensing information being the first sensing current value.

Alternatively, the controller is configured to control the transmitting coil to increase or reduce the at least one of the capacitance of the capacitor assembly and the inductance of the inductor assembly in response to the resonant frequency changing.

Alternatively, the controller is further configured to receive second sensing information sensed from the transmitting coil after controlling the transmitting coil to increase the at least one of the capacitance of the capacitor assembly and the inductance of the inductor assembly, determine whether the second sensing information is greater than the first sensing information, and control the transmitting coil to reduce the at least one of the capacitance of the capacitor assembly and the inductance of the inductor assembly in response to the second sensing information being not greater than the first sensing information. The second sensing information comprises a second sensing voltage value or a second sensing current value. The first sensing information is the first sensing voltage value in response to the second sensing information being the second sensing voltage value. The first sensing information is the first sensing current value in response to the second sensing information being the second sensing current value.

Alternatively, the controller is further configured to receive fourth sensing information sensed from the transmitting coil after controlling the transmitting coil to reduce the at least one of the capacitance of the capacitor assembly and the inductance of the inductor assembly, determine whether the fourth sensing information is greater than the first sensing information, and control the transmitting coil to increase the at least one of the capacitance of the capacitor assembly and the inductance of the inductor assembly in response to the fourth sensing information being not greater than the first sensing information. The fourth sensing information includes a fourth sensing voltage value or a fourth sensing current value. The first sensing information is the first sensing voltage value in response to the fourth sensing information being the fourth sensing voltage value. The first sensing information is the first sensing current value in response to the fourth sensing information being the fourth sensing current value.

Alternatively, the controller is further configured to determine whether the second sensing information reaches a first preset optimal sensing information in response to the second sensing information being greater than the first sensing information; and control the transmitting coil to continue to increase the at least one of the capacitance of the capacitor assembly and the inductance of the inductor assembly in response to the second sensing information not reaching the first preset optimal sensing information. The first preset optimal sensing information is a first optimal sensing voltage value in response to the second sensing information being the second sensing voltage value. The first optimal sensing information is a first optimal sensing current value in response to the second sensing information being the second sensing current value.

Alternatively, the controller is further configured to determine whether the fourth sensing information reaches a second preset optimal sensing information in response to the fourth sensing information being greater than the first sensing information, and control the transmitting coil to continue to reduce the at least one of the capacitance of the capacitor assembly and the inductance of the inductor assembly in response to the fourth sensing information not reaching the second preset optimal sensing information. The second preset optimal sensing information is a second optimal sensing voltage value in response to the fourth sensing information being the fourth sensing voltage value. The second optimal sensing information is a second optimal sensing current value in response to the fourth sensing information being the fourth sensing current value.

Alternatively, the controller is further configured to receive third sensing information sensed from the transmitting coil after controlling the transmitting coil to reduce the at least one of the capacitance of the capacitor assembly and the inductance of the inductor assembly, determine whether the third sensing information is greater than the second sensing information, and control the transmitting coil to increase the at least one of the capacitance of the capacitor assembly and the inductance of the inductor assembly in response to the third sensing information being not greater than the second sensing information. The second sensing information is the second sensing voltage value in response to the third sensing information being a third sensing voltage value. The second sensing information is the second sensing current value in response to the third sensing information being a third sensing current value.

Alternatively, the controller is further configured to receive fifth sensing information sensed from the transmitting coil after controlling the transmitting coil to increase the at least one of the capacitance of the capacitor assembly and the inductance of the inductor assembly, determine whether the fifth sensing information is greater than the fourth sensing information, and control the transmitting coil to reduce the at least one of the capacitance of the capacitor assembly and the inductance of the inductor assembly in response to the fifth sensing information being not greater than the second sensing information. The fifth sensing information comprises a fifth sensing voltage value or a fifth sensing current value. The fourth sensing information is the fourth sensing voltage value in response to the fifth sensing information being the fifth sensing voltage value. The fourth sensing information is the fourth sensing current value in response to the fifth sensing information being the fifth sensing current value.

Alternatively, the controller is further configured to determine whether the third sensing information reaches the first preset optimal sensing information in response to the third sensing information being greater than the second sensing information; and control the transmitting coil to continue to reduce the at least one of the capacitance of the capacitor assembly and the inductance of the inductor assembly in response to the third sensing information not reaching the first preset optimal sensing information. The first preset optimal sensing information is the first optimal sensing voltage value in response to the third sensing information being the third sensing voltage value. The first preset optimal sensing information is the first optimal sensing current value in response to the third sensing information being the third sensing current value.

Alternatively, the controller is further configured to determine whether the fifth sensing information reaches the second preset optimal sensing information in response to the fifth sensing information being greater than the fourth sensing information, and control the transmitting coil to continue to increase the at least one of the capacitance of the capacitor assembly and the inductance of the inductor assembly in response to the fifth sensing information not reaching the second preset optimal sensing information. The second preset optimal sensing information is the second optimal sensing voltage value in response to the fifth sensing information being the fifth sensing voltage value. The second preset optimal sensing information is the second optimal sensing current value in response to the fifth sensing information being the fifth sensing current value.

In some embodiments, a power matching method for wireless charging for the wireless transmitter in the wireless charging system is provided. The method includes: receiving first sensing information sensed from the transmitting coil; detecting whether resonant frequency has changed according to the first sensing information; and adjusting at least one of capacitance of the capacitor assembly in the transmitting coil of the wireless transmitter and adjusting inductance of the inductor assembly in the transmitting coil in response to the resonant frequency changing to make transmitting power of the wireless transmitter be matched with receiving power of a wireless receiver in the wireless charging system; wherein the first sensing information includes at least one of a first sensing voltage value and a first sensing current value.

Alternatively, the detecting whether the resonant frequency has changed according to the first sensing information comprises: determining whether the first sensing information is less than a preset feedback information threshold; and determining that the resonant frequency has changed in response to the first sensing information being less than the preset feedback information threshold. The preset feedback information threshold is a voltage threshold in response to the first sensing information being the first sensing voltage value, and the preset feedback information threshold is a current threshold in response to the first sensing information being the first sensing current value.

Alternatively, the adjusting the at least one of the capacitance of the capacitor assembly in the transmitting coil of the wireless transmitter and the inductance of the inductor assembly in the transmitting coil comprises increasing or reducing the at least one of the capacitance of the capacitor assembly in the transmitting coil and the inductance of the inductor assembly in the transmitting coil.

Alternatively, the adjusting the at least one of the capacitance of the capacitor assembly in the transmitting coil of the wireless transmitter and the inductance of the inductor assembly in the transmitting coil further comprises: after increasing the at least one of the capacitance of the capacitor assembly in the transmitting coil and the inductance of the inductor assembly in the transmitting coil, receiving second sensing information sensed from the transmission coil; determining whether the second sensing information is greater than the first sensing information; and reducing the at least one of the capacitance of the capacitor assembly in the transmitting coil and the inductance of the inductor assembly in the transmitting coil in response to the second sensing information being not greater than the first sensing information. The second sensing information comprises: a second sensing voltage value or a second sensing current value, the first sensing information is the first sensing voltage value in response to the second sensing information being the second sensing voltage value, and the first sensing information is the first sensing current value in response to the second sensing information being the second sensing current value.

Alternatively, the adjusting the at least one of the capacitance of the capacitor assembly in the transmitting coil of the wireless transmitter and the inductance of the inductor assembly in the transmitting coil further comprises: after reducing the at least one of the capacitance of the capacitor assembly in the transmitting coil and the inductance of the inductor assembly in the transmitting coil, receiving fourth sensing information sensed from the transmission coil; determining whether the fourth sensing information is greater than the first sensing information; and increasing the at least one of the capacitance of the capacitor assembly in the transmitting coil and the inductance of the inductor assembly in the transmitting coil in response to the fourth sensing information being not greater than the first sensing information. The second sensing information comprises: a fourth sensing voltage value or a fourth sensing current value. The first sensing information is the first sensing voltage value in response to the fourth sensing information being the fourth sensing voltage value. The first sensing information is the first sensing current value in response to the fourth sensing information being the fourth sensing current value.

Alternatively, the adjusting the at least one of the capacitance of the capacitor assembly in the transmitting coil of the wireless transmitter and the inductance of the inductor assembly in the transmitting coil further comprises: determining whether the second sensing information reaches a first preset optimal sensing information in response to the second sensing information being greater than the first sensing information; and continuing to increase the at least one of the capacitance of the capacitor assembly in the transmitting coil and the inductance of the inductor assembly in the transmitting coil in response to the second sensing information not reaching the first preset optimal sensing information. The first preset optimal sensing information is a first optimal sensing voltage value in response to the second sensing information being the second sensing voltage value, and the first preset optimal sensing information is a first optimal sensing current value in response to the second sensing information is the second sensing current value.

Alternatively, the adjusting the at least one of the capacitance of the capacitor assembly in the transmitting coil of the wireless transmitter and the inductance of the inductor assembly in the transmitting coil further comprises: determining whether the fourth sensing information reaches a second preset optimal sensing information in response to the fourth sensing information being greater than the first sensing information; and continuing to reduce the at least one of the capacitance of the capacitor assembly in the transmitting coil and the inductance of the inductor assembly in the transmitting coil in response to the fourth sensing information not reaching the second preset optimal sensing information. The second preset optimal sensing information is a second optimal sensing voltage value in response to the fourth sensing information being the fourth sensing voltage value. The second preset optimal sensing information is a second optimal sensing current value in response to the fourth sensing information being the fourth sensing current value.

Alternatively, the adjusting the at least one of the capacitance of the capacitor assembly in the transmitting coil of the wireless transmitter and the inductance of the inductor assembly in the transmitting coil further comprises: after reducing the at least one of the capacitance of the capacitor assembly in the transmitting coil and the inductance of the inductor in the transmitting coil, receiving third sensing information sensed from the transmission coil; determining whether the third sensing information is greater than the second sensing information; and increasing the at least one of the capacitance of the capacitor assembly in the transmitting coil and the inductance of the inductor in the transmitting coil in response to the third sensing information being not greater than the second sensing information. The third sensing information comprises: a third sensing voltage value or a third sensing current value, the second sensing information is the second sensing voltage value in response to the third sensing information being the third sensing voltage value, and the second sensing information is the second sensing current value in response to the third sensing information being the third sensing current value.

Alternatively, the adjusting the at least one of the capacitance of the capacitor assembly in the transmitting coil at the wireless transmitter and the inductance of the inductor assembly in the transmitting coil further comprises: after increasing the at least one of the capacitance of the capacitor assembly in the transmitting coil and the inductance of the inductor assembly in the transmitting coil, receiving fifth sensing information sensed from the transmission coil; determining whether the fifth sensing information is greater than the fourth sensing information; and reducing the at least one of the capacitance of the capacitor assembly in the transmitting coil and the inductance of the inductor in the transmitting coil in response to the fifth sensing information being not greater than the fourth sensing information. The fifth sensing information comprises: a fifth sensing voltage value or a fifth sensing current value, the fourth sensing information is the fourth sensing voltage value in response to the fifth sensing information being the fifth sensing voltage value. The fourth sensing information is the fourth sensing current value in response to the fifth sensing information being the fifth sensing current value.

Alternatively, the adjusting the at least one of the capacitance of the capacitor assembly in the transmitting coil of the wireless transmitter and the inductance of the inductor in the transmitting coil further comprises: determining whether the third sensing information reaches the first preset optimal sensing information in response to the third sensing information being greater than the second sensing information; and continuing to reduce the at least one of the capacitance of the capacitor assembly in the transmitting coil and the inductance of the inductor in the transmitting coil in response to the third sensing information not reaching the first preset optimal sensing information. The optimal sensing information is the first optimal sensing voltage value in response to the third sensing information being the third sensing voltage value, and the first preset optimal sensing information is the first optimal sensing current value in response to the third sensing information being the third sensing current value.

Alternatively, the adjusting the at least one of the capacitance of the capacitor assembly in the transmitting coil of the wireless transmitter and the inductance of the inductor in the transmitting coil further comprises: determining whether the fifth sensing information reaches the second preset optimal sensing information in response to the fifth sensing information being greater than the fourth sensing information; and continuing to increase the at least one of the capacitance of the capacitor assembly in the transmitting coil and the inductance of the inductor in the transmitting coil in response to the fifth sensing information not reaching the second preset optimal sensing information. The second preset optimal sensing information is the second optimal sensing voltage value in response to the fifth sensing information being the fifth sensing voltage value, and the second preset optimal sensing information is the second optimal sensing current value in response to the fifth sensing information being the fifth sensing current value.

In some embodiments, a wireless charging apparatus is provided. The wireless charging apparatus includes a power matching apparatus for wireless charging. The power matching apparatus for wireless charging is for a wireless transmitter and includes a transmitting coil and a controller electrically connected with the transmitting coil. The transmitting coil includes at least one of a capacitor assembly with adjustable capacitance and an inductor assembly with adjustable inductance. The controller electrically is configured to receive first sensing information sensed from the transmitting coil, detect whether resonant frequency has changed according to the first sensing information, and adjust at least one of capacitance of the capacitor assembly and inductance of the inductor assembly to make transmitting power of the wireless transmitter be matched with receiving power of the wireless receiver in response to the resonant frequency being changed, wherein the first sensing information comprises a first sensing voltage value or a first sensing current value.

Alternatively, the inductor assembly with adjustable inductance comprises at least one inductance branch. All inductance branches are connected in series with each other in response to the number of the at least one inductance branch being more than one. Each inductance branch comprises an inductor and a switch connected in parallel with the inductor.

Alternatively, the capacitor assembly with adjustable capacitance comprises at least one first capacitance branch and/or at least one second capacitance branch. The at least one first capacitance branch is connected in series with the at least one second capacitance branch in response to the capacitor assembly comprising the at least one first capacitance branch and the at least one second capacitance branch. All first capacitance branches are connected in parallel with each other, and all second capacitance branches are connected in parallel with each other, and each of the at least one of first capacitance branch and the at least one of second capacitance branch includes a capacitor and a switch connected in series with the capacitor.

Alternatively, the controller is configured to determine whether the first sensing information is less than a preset feedback information threshold, and determine that the resonant frequency has changed in response to the first sensing information being less than the preset feedback information threshold, the preset feedback information threshold is a voltage threshold in response to the first sensing information being the first sensing voltage value, and the preset feedback information threshold is a current threshold in response to the first sensing information being the first sensing current value.

Since capacitance and inductance in existing wireless charging schemes are fixed, in order to ensure a specified resonant frequency (such as 110 khz), a user needs to accurately place an equipment to be charged on a wireless charging apparatus (such as a charging base). Otherwise, drift of the resonant frequency will be occurred, and under these circumstances, if a transmitter and a receiver still use current frequency, a lot of energy will be wasted and charging efficiency will be reduced. Energy not used for charging will be radiated in a form of heat, resulting in increasing temperature of the equipment to be charged, and resulting in potential safety hazards for the equipment to be charged.

In addition, an existing electromagnetic induction wireless charging method has poor resistance to foreign object attack. For example, if there are foreign objects such as hair and coins between the equipment to be charged and the wireless charging apparatus, the resonance frequency will also drift. When the resonant frequency drifts too much, most of power of the wireless charging apparatus will directly radiate in the form of heat, resulting in potential safety problems.

Figure 2:
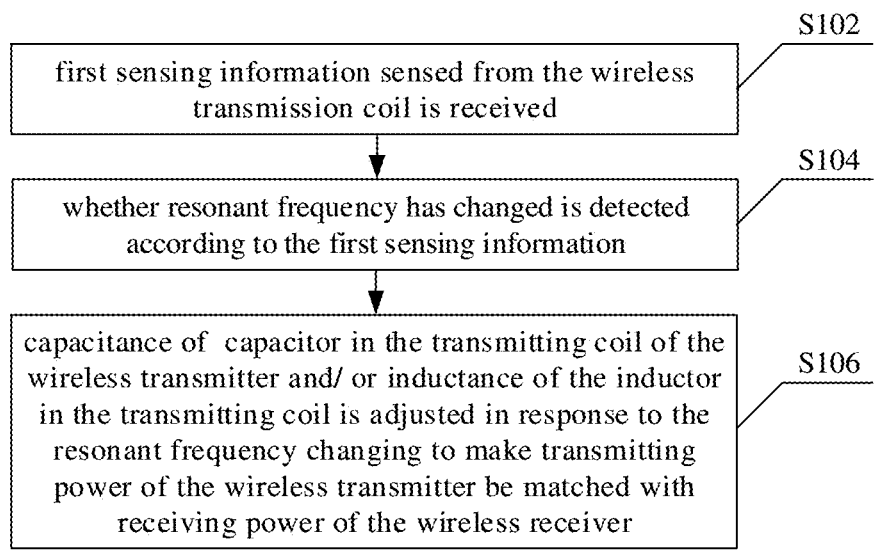
FIG. 2 shows a flowchart of a power matching method for wireless charging provided by some embodiments.

FIG. 2 is a flowchart of a power matching method for wireless charging provided by some embodiments. For example, the method shown in FIG. 2 can be applied to a wireless transmitter in a wireless charging system, and a transmitting coil of the wireless transmitter includes at least one of a capacitor assembly with adjustable capacitance and an inductor assembly with adjustable inductance.

As shown in FIG. 2, the power matching method 10 for wireless charging includes following operations.

At block S102, first sensing information sensed from the wireless transmission coil is received.

The first sensing information can be, for example, feedback information sent by a wireless transmitter from a receiving coil of a wireless receiver to the transmitting coil of the wireless transmitter by a means of electromagnetic coupling. The feedback information can be, for example, a voltage value or a current value of an alternating current (AC) obtained by the wireless receiver converting received electromagnetic signals through the receiving coil, or a voltage value or a current value of a direct current (DC) obtained after rectifying and/or filtering the AC through a shaping circuit of the wireless receiver.

Alternatively, the wireless receiver can also communicate with the wireless transmitter through at least one of the communication modes such as Bluetooth, WiFi, mobile cellular network (such as 2G, 3G, 4G or 5G), wireless communication (such as LEEE 802.11, 802.15 (WPANs), 802.16 (WiMAX), 802.20, etc.), short-range wireless communication based on high-frequency antenna (such as 60 GHz), optical communication (such as infrared communication), ultrasonic communication and ultra wideband (UMB) communication to send the feedback information to the wireless transmitter. The present disclosure is not limited thereto.

The first sensing information may include, for example, a first sensing voltage value or a first sensing current value.

In addition, the first sensing information may also be, for example, a voltage value or a current value of the AC at the wireless transmitter sensed by the wireless transmitter from the transmitting coil.

At block S104, whether resonant frequency has changed is detected according to the first sensing information.

As mentioned above, due to influence of parasitic inductance capacitance and load in circuits and different charging positions, there is a slight change between actual resonant frequency and ideal resonant frequency. In addition, if the transmitting coil of the wireless transmitter is not accurately aligned with the receiving coil of the wireless receiver, or if there are foreign objects such as hair and coins between the wireless transmitter and the wireless receiver, the drift of the resonant frequency will be caused. The resonant frequency is inconsistent with ideal resonant frequency.

Whether a load of the wireless receiver has changed can be reflected by detecting the first sensing voltage value or the first sensing current value. Therefore, whether the resonant frequency has changed can be detected according to the first sensing voltage value or the first sensing current value. For example, the first sensing information may be compared with a preset feedback information threshold to determine whether the first sensing information is less than the preset feedback information threshold. When the first sensing information is less than the preset feedback information threshold, the resonant frequency has changed is determined. The preset feedback information threshold is a voltage threshold in response to the first sensing information being the first sensing voltage value. The preset feedback information threshold is a current threshold in response to the first sensing information being the first sensing current value. The voltage threshold and current threshold can be set according to actual needs in practical application, and the present disclosure is not limited thereto.

At block S106, at least one of capacitance of capacitance in the transmitting coil of the wireless transmitter and inductance of the inductor in the transmitting coil of the wireless transmitter is adjusted in response to the resonant frequency changing to make transmitting power of the wireless transmitter be matched with receiving power of the wireless receiver.

The transmitting power of the wireless transmitter will not be matched with the receiving power of the wireless receiver in response to the resonant frequency changing, causing most of power of the wireless receiver to radiate in a form of heat. Under these circumstances, not only charging efficiency of the wireless charging system is reduced, but also temperature of the wireless receiver is increased, thus bringing potential safety hazards to the equipment.

The at least one of the capacitance of the capacitor assembly in the transmitting coil of the wireless transmitter and the inductance of the inductor assembly in the transmitting coil of the wireless transmitter can be adjusted in response to detecting that the resonant frequency has changed to make the transmitting power of the wireless transmitter be matched with the receiving power of the wireless receiver.

For example, whether the transmitting power is matched with the receiving power can be determined by the charging efficiency of the wireless charging system. For example, the charging efficiency can be a ratio of the receiving power to the transmitting power. If the current charging efficiency reaches a preset efficiency threshold or reaches a preset efficiency range, it is considered that the transmitting power obtained after adjusting the at least one of the capacitance of the capacitor assembly and the inductance of the inductor assembly is matched with the receiving power. The preset efficiency threshold and the preset efficiency range can be set according to the actual needs in practical application, or can also be determined according to system efficiency specified in the QI wireless charging standards.

In the power matching method for wireless charging provided by the exemplary embodiment of the present disclosure, whether the resonant frequency has changed is detected according to a voltage value or a current value fed back by the wireless receiver, and the at least one of the capacitance of the capacitor assembly and the inductance of the inductor assembly in the transmitting coil of the wireless transmitter is adjusted to make the transmitting power of the wireless transmitter be matched with the receiving power of the wireless receiver in response to the resonant frequency changing. The method can effectively avoid reduction of the charging efficiency and the wireless receiver generating heat caused by the change of resonant frequency.

It should be clearly understood that the present disclosure describes how to form and use specific examples, but principles of the present disclosure are not limited to any details of these exemplary embodiments. On the contrary, based on the teachings of the contents of the present disclosure, these principles can be applied to many other embodiments.

Figure 3:
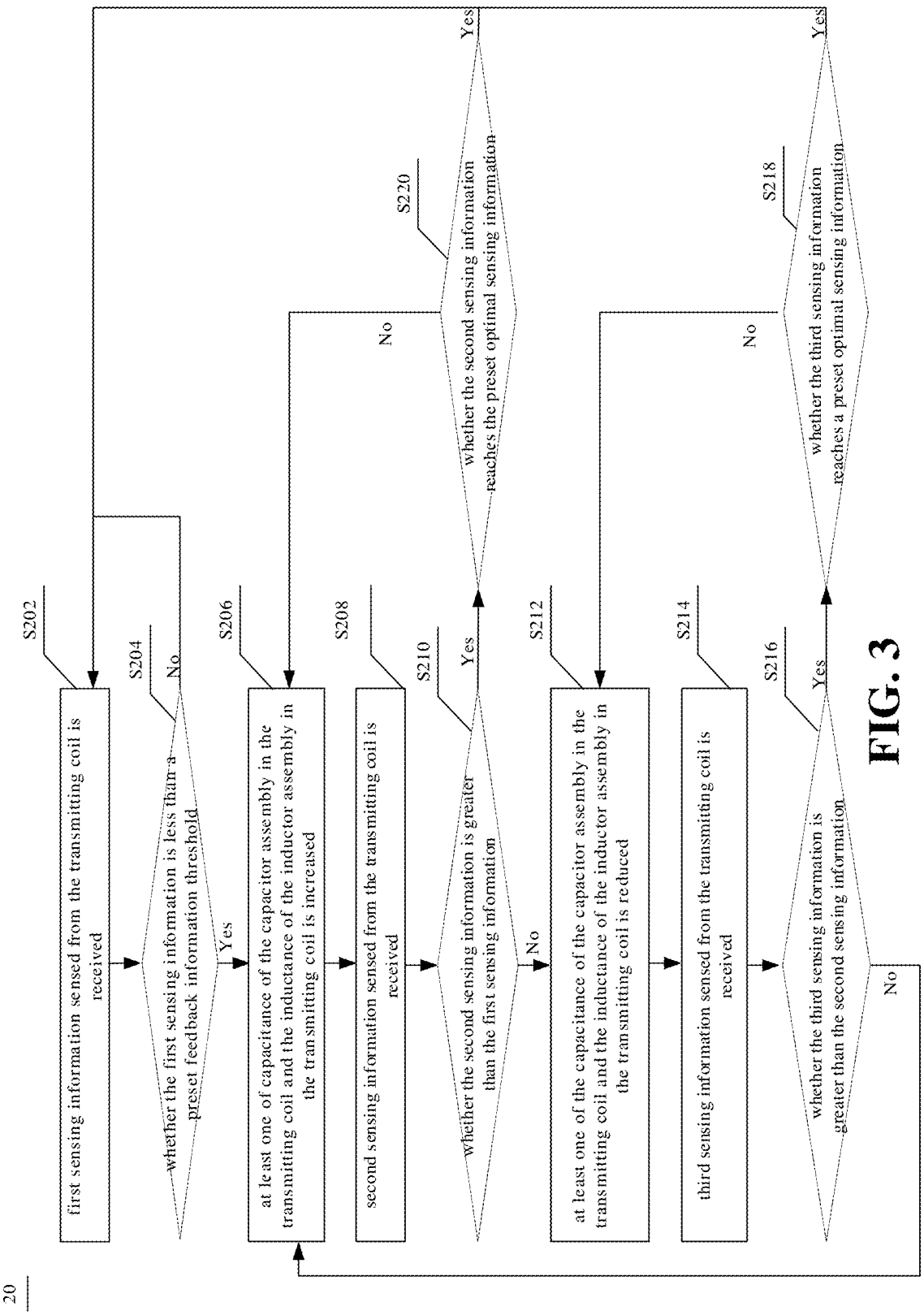
FIG. 3 shows a flowchart of another power matching method for wireless charging provided by some embodiments.

FIG. 3 shows a flowchart of another power matching method for wireless charging provided by some embodiments. Similarly, the method shown in FIG. 3, for example, can be applied to a wireless transmitter in a wireless charging system. A transmitting coil of the wireless transmitter includes a capacitor assembly with adjustable capacitance and an inductor assembly with adjustable inductance.

Referring to FIG. 3, the power matching method 20 for wireless charging includes the following operations.

At block S202, first sensing information sensed from the transmitting coil is received.

In some embodiments, the first sensing information can be feedback information sent by a wireless transmitter from the receiving coil of the wireless receiver to a transmitting coil of the wireless transmitter by a means of electromagnetic coupling. The feedback information can be, for example, a voltage value or a current value of an AC obtained by the wireless receiver converting received electromagnetic signals through the receiving coil, or a voltage value or a current value of a DC obtained after rectifying and/or filtering the AC through a shaping circuit of the wireless receiver.

Alternatively, the wireless receiver can also communicate with the wireless transmitter through at least one of the communication modes such as Bluetooth, WiFi, mobile cellular network (such as 2G, 3G, 4G or 5G), wireless communication (such as LEEE 802.11, 802.15 (WPANs), 802.16 (WiMAX), 802.20, etc.), short-range wireless communication based on high-frequency antenna (such as 60 GHz), optical communication (such as infrared communication), ultrasonic communication and ultra wideband (UMB) communication to send the feedback information to the wireless transmitter. The disclosure is not limited thereto.

The first sensing information may include, for example, a first sensing voltage value or a first sensing current value.

In addition, the first sensing information may also be, for example, a voltage value or a current value of the AC at the wireless transmitter sensed by the wireless transmitter from the transmitting coil.

At block S204, whether the first sensing information is less than a preset feedback information threshold is determined.

If the first sensing information is less than the preset feedback information threshold, proceed to operations at block S206, otherwise, return to operations at block S202 and wait to receive a voltage value or a current value fed back by the wireless receiver in a next cycle.

Whether a resonance frequency has changed can be detected by determining whether the first sensing information is less than the preset feedback information threshold.

The preset feedback information threshold is a voltage threshold in response to the first sensing information being a first sensing voltage value. The preset feedback information threshold is a current threshold in response to the first sensing information being a first sensing current value. The voltage threshold and current threshold can be set based on the actual needs in practical application, and the present disclosure is not limited thereto.

At block S206, at least one of capacitance of the capacitor assembly in the transmitting coil and inductance of the inductor assembly in the transmitting coil is increased.

For example, a preset adjustment step can be added each time in response to increasing at least one of the capacitance of the capacitor assembly in the transmitting coil and the inductance of the inductor assembly in the transmitting coil. If the capacitance of the capacitor assembly is increased, a preset capacitance adjustment step can be increased each time. If the inductance of the inductor assembly is increased, a preset inductance adjustment step can be increased each time. The preset capacitance adjustment step and the preset inductance adjustment step can be set based on the actual needs in practical application.

At block S208, second sensing information sensed from the transmitting coil is received.

After increasing at least one of the capacitance of the capacitor assembly in the transmitting coil and the inductance of the inductor assembly in the transmitting coil, for example, the second sensing information can be received at a next preset time interval, and whether adjustment direction of operations at block S206 is correct can be determined according to the second sensing information. The preset time interval may be, for example, a control cycle for controlling an LC filter composed of inductance and capacitance, or a plurality of the control cycles, and the present disclosure is not limited thereto.

The second sensing information may include a second sensing voltage value or a second sensing current value.

At block S210, whether the second sensing information is greater than the first sensing information is determined.

If the second sensing information is not greater than the first sensing information, proceed to operations at block S212, otherwise, proceed to operations at block S220.

Whether the second sensing information is greater than the first sensing information is determined is whether the voltage value fed back by the wireless receiver increases after increasing the at least one of the capacitance of the capacitor assembly in the transmitting coil and the inductance of the inductor assembly in the transmitting coil. If there is no increase, it indicates that the adjustment direction of capacitor assembly or inductor assembly is incorrect, so proceed to operations at block S212.

The first sensing information is the first sensing voltage value in response to the second sensing information being the second sensing voltage value. The first sensing information is the first sensing current value in response to the second sensing information being the second sensing current value.

At block S212, the at least one of the capacitance of the capacitor in the transmitting coil and the inductance of the inductor assembly in the transmitting coil is reduced.

The preset adjustment step can also be reduced each time in response to reducing the at least one of the capacitance of the capacitor assembly in the transmitting coil and the inductance of the inductor assembly in the transmitting coil. If the capacitance of the capacitor assembly is reduced, the preset capacitance adjustment step can be reduced each time. If the inductance of the inductor assembly is reduced, the preset inductance adjustment step can be reduced each time.

At block S214, third sensing information sensed from the transmitting coil is received.

After reducing the at least one of the capacitance of the capacitor assembly in the transmitting coil and the inductance of the inductor assembly in the transmitting coil, for example, the third sensing information can be received at the next preset time interval, and whether adjustment direction of operations at block S212 is correct can be determined according to the third sensing information. As described above, the preset time interval may be, for example, one or more of the above control cycles.

The third sensing information may include a third sensing voltage value or a third sensing current value.

At block S216, whether the third sensing information is greater than the second sensing information is determined.

If the third sensing information is greater than the second sensing information, proceed to operations at block S218, otherwise, return to operations at block S206.

Whether the third sensing information is greater than the second sensing information is determined, that is, whether the voltage value fed back by the wireless receiver increases after reducing the at least one of the capacitance of the capacitor assembly in the transmitting coil and the inductance of the inductor assembly in the transmitting coil. If there is an increase, it indicates that the adjustment direction of the at least one of the capacitance of the capacitor assembly and the inductance of the inductor assembly is correct, and proceed to operations at block S218.

The second sensing information is the second sensing voltage value in response to the third sensing information being the third sensing voltage value. The second sensing information is the second sensing current value in response to the third sensing information being the third sensing current value.

At block S218, whether the third sensing information reaches a preset optimal sensing information is determined.

If the third sensing information does not reach the optimal sensing information, return to operations at block S212, otherwise, end the adjustment, return to operations at block S202, and wait to receive the voltage value or the current value fed back by the wireless receiver in the next cycle.

The optimal sensing information is an optimal sensing voltage value in response to the third sensing information being the third sensing voltage value. The optimal sensing information is an optimal sensing current value in response to the third sensing information being the third sensing current value.

At block S220, whether the second sensing information reaches the preset optimal sensing information is determined.

If the second sensing information does not reach the optimal sensing information, return to operations at block S206, otherwise, end the adjustment, return to operations at block S202, and wait to receive the voltage value or the current value fed back by the wireless receiver in the next cycle.

The optimal sensing information is the optimal sensing voltage value in response to the second sensing information being the second sensing voltage value. The optimal sensing information is the optimal sensing current value in response to the second sensing information being the second sensing current value.

The optimal sensing voltage value or the optimal sensing current value can be determined, for example, according to the aforementioned charging efficiency threshold or efficiency range. As mentioned above, the charging efficiency is determined by the transmitting power of the wireless transmitter and the receiving power of the wireless receiver. Therefore, the optimal sensing voltage value or the optimal sensing current value can be determined by presetting the charging efficiency threshold or the efficiency range. The efficiency threshold and efficiency range can be set according to the actual needs in practical application, or can also be determined according to the system efficiency specified in the QI wireless charging standards.

In the power matching method for wireless charging provided by the embodiment of the present disclosure, after adjusting capacitance or the inductance in the transmitting coil, whether direction of previous adjustment is correct is determined through the feedback voltage sent by the wireless transmitter received in the next cycle, and whether the transmitting power is matched with the receiving power is determined by determining whether the feedback voltage reaches the optimal voltage. Similarly, the method can effectively avoid reduction of the charging efficiency and the wireless receiver generating heat caused by the change of resonant frequency.

Figure 4:
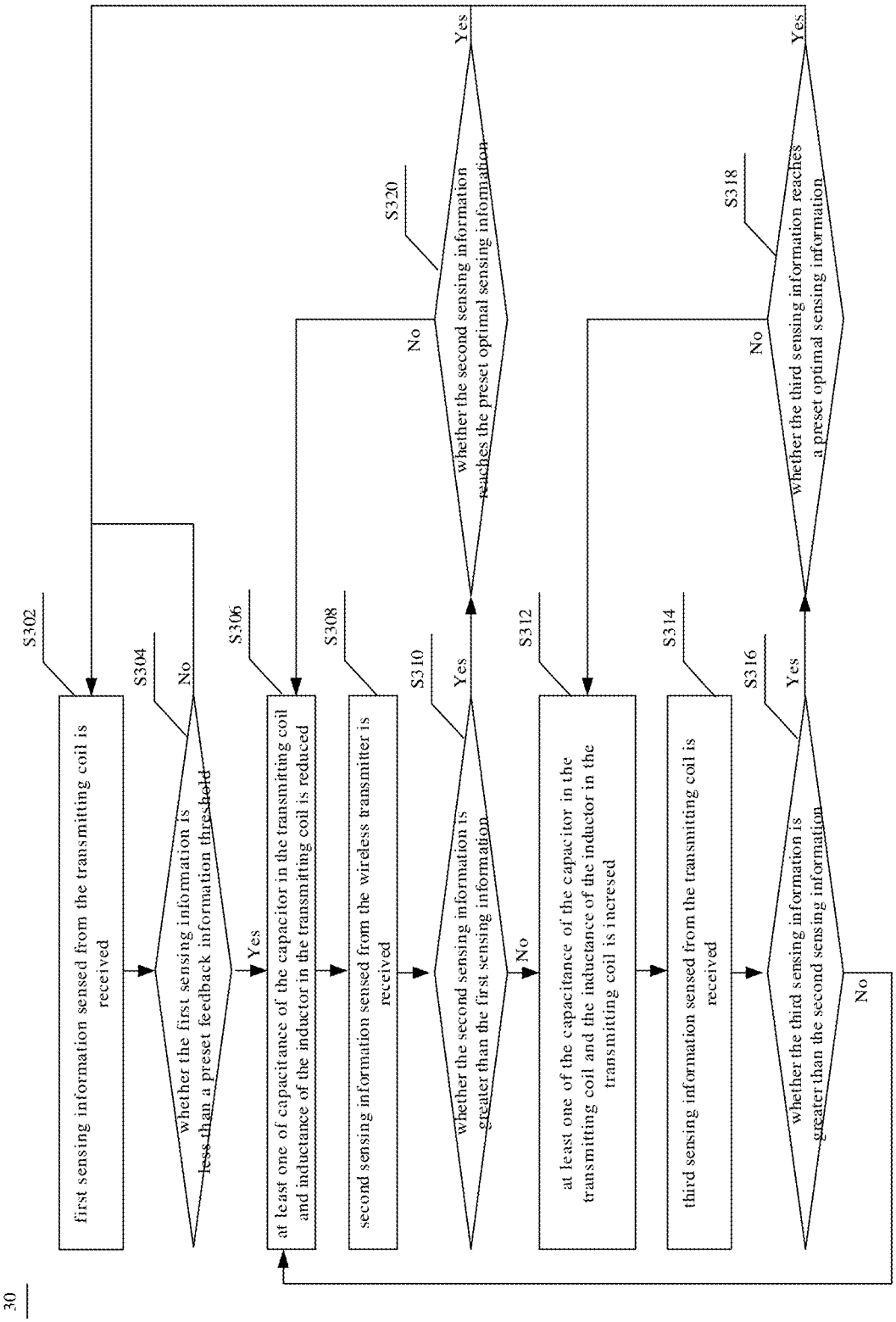
FIG. 4 shows a flowchart of another power matching method for wireless charging provided by some embodiments.

FIG. 4 shows a flowchart of another power matching method for wireless charging provided by some embodiments. Similarly, the method shown in FIG. 4, for example, can be applied to a wireless transmitter in a wireless charging system. A transmitting coil of the wireless transmitter includes a capacitor assembly with adjustable capacitance and an inductor assembly with adjustable inductance.

Referring to FIG. 4, the power matching method 30 for wireless charging includes the following operations.

At block S302, first sensing information sensed from the transmitting coil is received.

The first sensing information can be, for example, feedback information sent by a wireless transmitter from the receiving coil of the wireless receiver to a transmitting coil of the wireless transmitter by a means of electromagnetic coupling. The feedback information can be, for example, a voltage value or a current value of an AC obtained by the wireless receiver converting received electromagnetic signals through the receiving coil, or a voltage value or a current value of a DC obtained after rectifying and/or filtering the AC through a shaping circuit of the wireless receiver.

Alternatively, the wireless receiver can also communicate with the wireless transmitter through at least one of the communication modes such as Bluetooth, WiFi, mobile cellular network (such as 2G, 3G, 4G or 5G), wireless communication (such as LEEE 802.11, 802.15 (WPANs), 802.16 (WiMAX), 802.20, etc.), short-range wireless communication based on high-frequency antenna (such as 60 GHz), optical communication (such as infrared communication), ultrasonic communication and ultra wideband (UMB) communication to send the feedback information to the wireless transmitter. The disclosure is not limited thereto.

The first sensing information may include, for example, a first sensing voltage value or a first sensing current value.

In addition, the first sensing information may also be, for example, a voltage value or a current value of the AC at the wireless transmitter sensed by the wireless transmitter from the transmitting coil.

At block S304, whether the first sensing information is less than a preset feedback information threshold is determined.

If the first sensing information is less than the preset feedback information threshold, proceed to operations at block S306, otherwise, return to operations at block S302 and wait to receive a voltage value or a current value fed back by the wireless receiver in a next cycle.

Whether a resonance frequency has changed can be detected by determining whether the first sensing information is less than the preset feedback information threshold.

The preset feedback information threshold is a voltage threshold in response to the first sensing information being a first sensing voltage value. The preset feedback information threshold is a current threshold in response to the first sensing information being a first sensing current value. The voltage threshold and current threshold can be set according to the actual needs in practical application, and the present disclosure is not limited thereto.

At block S306, at least one of capacitance of the capacitor assembly in the transmitting coil and inductance of the inductor assembly in the transmitting coil is reduced.

For example, a preset adjustment step can be added each time in response to reducing the at least one of the capacitance of the capacitor assembly in the transmitting coil and the inductance of the inductor assembly in the transmitting coil. If the capacitance of the capacitor assembly is reduced, a preset capacitance adjustment step can be reduced each time. If the inductance of the inductor assembly is reduced, a preset inductance adjustment step can be reduced each time. The capacitance adjustment step and the inductance adjustment step can be set according to the actual needs in practical application.

At block S308, second sensing information sensed from the transmitting coil is received.

After reducing the at least one of the capacitance of the capacitor assembly in the transmitting coil and the inductance of the inductor assembly in the transmitting coil, for example, the second sensing information can be received at a next preset time interval, and whether adjustment direction of operations at block S306 is correct can be determined according to the second sensing information. The preset time interval may be, for example, a control cycle for controlling an LC filter composed of inductance and capacitance, or a plurality of the control cycles, and the present disclosure is not limited thereto.

The second sensing information may include a second sensing voltage value or a second sensing current value.

At block S310, whether the second sensing information is greater than the first sensing information is determined.

If the second sensing information is not greater than the first sensing information, proceed to operations at block S312, otherwise, proceed to operations at block S320.

Whether the second sensing information is greater than the first sensing information is determined is whether the voltage value fed back by the wireless receiver increases after reducing the at least one of the capacitance of the capacitor assembly in the transmitting coil and the inductance of the inductor assembly in the transmitting coil. If there is no increase, it indicates that the adjustment direction of capacitance or inductance is incorrect, so proceed to operations at block S312.

The first sensing information is the first sensing voltage value in response to the second sensing information being the second sensing voltage value. The first sensing information is the first sensing current value in response to the second sensing information being the second sensing current value.

At block S312, the at least one of the capacitance of the capacitor assembly in the transmitting coil and the inductance of the inductor assembly in the transmitting coil is increased.

The preset adjustment step can also be reduced each time in response to increasing the at least one of the capacitance of the capacitor assembly in the transmitting coil and the inductance of the inductor assembly in the transmitting coil. If the capacitance of the capacitor is increased, the preset capacitance adjustment step can be increased each time. If the inductance of the inductor assembly is increased, the preset inductance adjustment step can be increased each time.

At block S314, third sensing information sensed from the transmitting coil is received.

After increasing the at least one of the capacitance of the capacitor assembly in the transmitting coil and the inductance of the inductor assembly in the transmitting coil, for example, the third sensing information can be received at the next preset time interval, and whether adjustment direction of operations at block S312 is correct can be determined according to the third sensing information. As described above, the preset time interval may be, for example, one or more of the above control cycles.

The third sensing information may include a third sensing voltage value or a third sensing current value.

At block S316, whether the third sensing information is greater than the second sensing information is determined.

If the third sensing information is greater than the second sensing information, proceed to operations at block S318, otherwise, return to operations at block S306.

Whether the third sensing information is greater than the second sensing information is determined, that is, whether the voltage value fed back by the wireless receiver increases after increasing the at least one of the capacitance of the capacitor assembly in the transmitting coil and the inductance of the inductor assembly in the transmitting coil. If there is an increase, it indicates that the adjustment direction of the at least one of the capacitance of the capacitor assembly and the inductance of the inductor assembly is correct, and proceed to operations at block S318.

The second sensing information is the second sensing voltage value in response to the third sensing information being the third sensing voltage value. The second sensing information is the second sensing current value in response to the third sensing information being the third sensing current value.

At block S318, whether the third sensing information reaches a preset optimal sensing information is determined.

If the third sensing information does not reach the optimal sensing information, return to operations at block S312, otherwise, end the adjustment, return to operations at block S302, and wait to receive the voltage value or the current value fed back by the wireless receiver in the next cycle.

The optimal sensing information is an optimal sensing voltage value in response to the third sensing information being the third sensing voltage value. The optimal sensing information is an optimal sensing current value in response to the third sensing information being the third sensing current value.

At block S320, whether the second sensing information reaches the preset optimal sensing information is determined.

If the second sensing information does not reach the optimal sensing information, return to operations at block S306, otherwise, end the adjustment, return to operations at block S302, and wait to receive the voltage value or the current value fed back by the wireless receiver in the next cycle.

The optimal sensing information is the optimal sensing voltage value in response to the second sensing information being the second sensing voltage value. The optimal sensing information is the optimal sensing current value in response to the second sensing information being the second sensing current value.

The optimal sensing voltage value or the optimal sensing current value can be determined, for example, according to the aforementioned charging efficiency threshold or efficiency range. As mentioned above, the charging efficiency is determined by the transmitting power of the wireless transmitter and the receiving power of the wireless receiver. Therefore, the optimal sensing voltage value or the optimal sensing current value can be determined by presetting the charging efficiency threshold or the efficiency range. The efficiency threshold and efficiency range can be set according to the actual needs in practical application, or can also be determined according to the system efficiency specified in the QI wireless charging standards.

In the power matching method for wireless charging provided by the embodiment of the present disclosure, after adjusting the capacitance or the inductance in the transmitting coil, whether direction of previous adjustment is correct is determined through the feedback voltage sent by the wireless transmitter received in the next cycle, and whether the transmitting power is matched with the receiving power is determined by determining whether the feedback voltage reaches the optimal voltage. Similarly, the method can effectively avoid reduction of the charging efficiency and the wireless receiver generating heat caused by the change of resonant frequency.

It should be noted that the above drawings are only for a schematic description of the processing included in the method according to the embodiments of the present disclosure, but not for limitation. It is easy to understand that the processes shown in the above drawings do not indicate or limit the chronological order of these processes. In addition, it is also easy to understand that these processes can be performed synchronously or asynchronously, for example, in multiple modules.

The following describes apparatuses provided by some embodiments of the present disclosure. The apparatuses can be used to perform the methods provided by embodiments of the present disclosure. For details not disclosed in the apparatuses provided by embodiments of the present disclosure, please refer to the methods provided by embodiments of the present disclosure.

Figure 5:
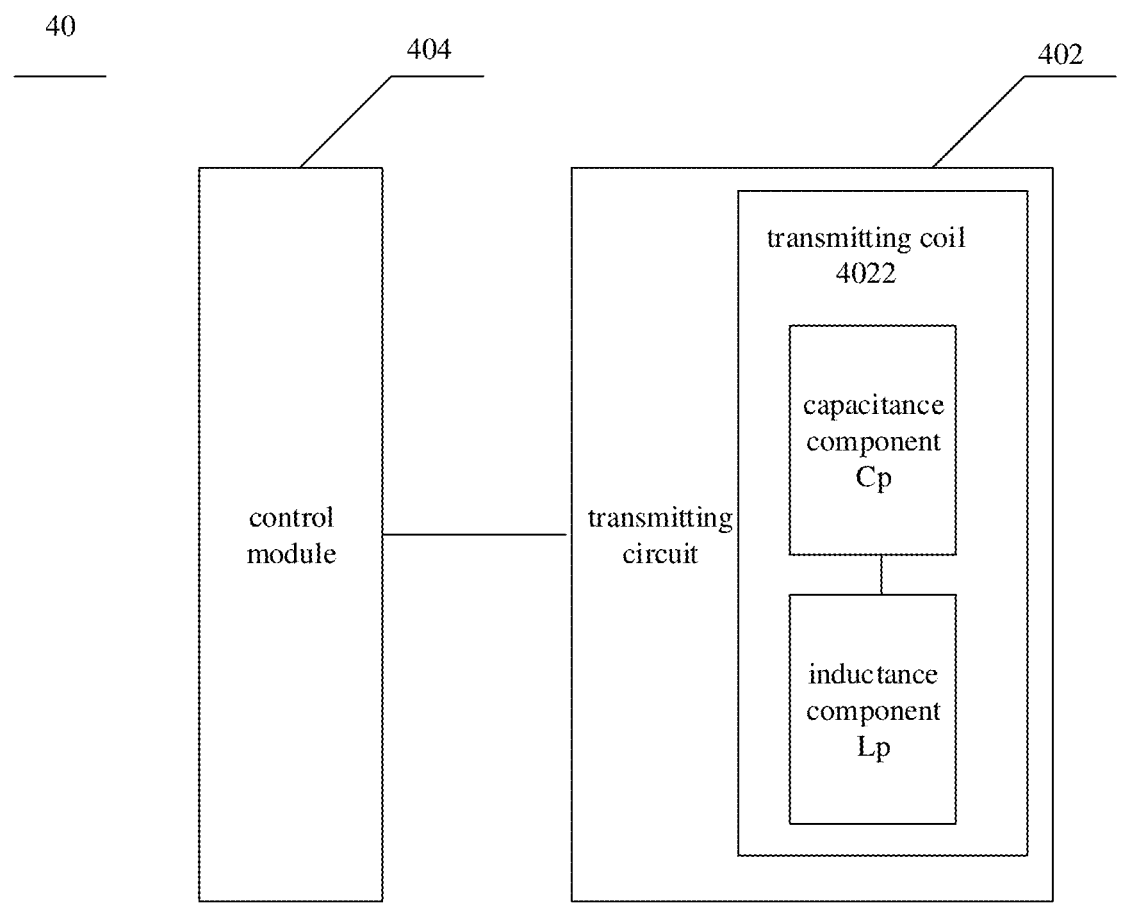
FIG. 5 shows a block diagram of a power matching apparatus for wireless charging provided by some embodiments.

FIG. 5 shows a block diagram of a power matching apparatus for wireless charging provided by some embodiments. The power matching apparatus 40 for wireless charging as shown in FIG. 5 can be applied to a wireless transmitter of a wireless charging system.

As shown in FIG. 5, the power matching apparatus 40 for wireless charging includes a transmitting circuit 402 and a controller 404.

The transmitting circuit 402 includes a transmitting coil 4022. The transmitting coil 4022 includes a capacitor assembly Cp with adjustable capacitance and an inductor assembly Lp with adjustable inductance. The capacitor assembly Cp is connected in series with the inductor assembly Lp.

The controller 404 may be implemented, for example, by a micro control unit (MCU). The controller 404 is electrically connected with the transmitting circuit 402 for receiving first sensing information sensed from the transmitting coil, detecting whether a resonant frequency has changed according to the first sensing information, and controlling the transmitting coil 4022 to adjust at least one of capacitance of the capacitor assembly Cp and inductance of the inductor assembly Lp in response to the resonant frequency changing to make transmitting power of the wireless transmitter be matched with receiving power of the wireless receiver. The first sensing information includes a first sensing voltage value or a first sensing current value.

In some embodiments, the controller 404 is configured to determine whether the first sensing information is less than a preset feedback information threshold, and determine that the resonant frequency has changed in response to the first sensing information being less than the preset feedback information threshold. The preset feedback information threshold is a voltage threshold in response to the first sensing information being the first sensing voltage value. When the first sensing information is the first sensing current value, the preset feedback information threshold is the current threshold.

In some embodiments, the controller 404 is configured to control the transmitting coil 4022 to increase the at least one of the capacitance of the capacitor assembly Cp and the inductance of the inductor assembly Lp in response to the resonant frequency changing.

In some embodiments, the controller 404 is also configured to receive second sensing information sensed from the transmitting coil after controlling the transmitting coil 4022 to increase the at least one of the capacitance of the capacitor assembly Cp and the inductance of the inductor assembly Lp, for example, at the next preset time interval, determine whether the second sensing information is greater than the first sensing information, and control the transmitting coil 4022 to reduce the at least one of the capacitance of the capacitor assembly Cp and the inductance of the inductor assembly Lp in response to the second sensing information being not greater than the first sensing information. The second sensing information includes a second sensing voltage value or a second sensing current value. The first sensing information is the first sensing voltage value in response to the second sensing information being the second sensing voltage value. The first sensing information is the first sensing current value in response to the second sensing information being the second sensing current value.

In some embodiments, the controller 404 is also configured to determine whether the second sensing information reaches preset optimal sensing information in response to the second sensing information being greater than the first sensing information, and control the transmitting coil 4022 to continue to increase the at least one of the capacitance of the capacitor assembly Cp and the inductance of the inductor assembly Lp in response to the second sensing information not reaching the optimal sensing information. The optimal sensing information is an optimal sensing voltage value in response to the second sensing information being the second sensing voltage value. The optimal sensing information is an optimal sensing current value in response to the second sensing information being the second sensing current value.

In some embodiments, the controller 404 is also configured to receive third sensing information sensed from the transmitting coil after controlling the transmitting coil 4022 to reduce the at least one of the capacitance of the capacitor assembly Cp and the inductance of the inductor assembly Lp, for example, at the next preset time interval, determine whether the third sensing information is greater than the second sensing information, and control the transmitting coil 4022 to increase the at least one of the capacitance of the capacitor assembly Cp and the inductance of the inductor assembly Lp in response to the third sensing information being not greater than the second sensing information. The third sensing information includes a third sensing voltage value or a third sensing current value. The second sensing information is the second sensing voltage value in response to the third sensing information being the third sensing voltage value. The second sensing information is the second sensing current value in response to the third sensing information being the third sensing current value.

In some embodiments, the controller 404 is also configured to determine whether the third sensing information reaches the preset optimal sensing information in response to the third sensing information being greater than the second sensing information; and in response to the third sensing information not reaching the optimal sensing information, control the transmitting coil 4022 to continue to reduce the at least one of the capacitance of the capacitor assembly Cp and the inductance of the inductor assembly Lp. The optimal sensing information is the optimal sensing voltage value in response to the third sensing information being the third sensing voltage value. The optimal sensing information is the optimal sensing current value in response to the third sensing information being the third sensing current value.

In some embodiments, the controller 404 is configured to control the transmitting coil 4022 to reduce the at least one of the capacitance of the capacitor assembly Cp and the inductance of the inductor assembly Lp in response to the resonant frequency changing.

In some embodiments, the controller 404 is also configured to receive the second sensing information sensed from the transmitting coil after controlling the transmitting coil 4022 to reduce the at least one of the capacitance of the capacitor assembly Cp and the inductance of the inductor assembly Lp, for example, at the next preset time interval, determine whether the second sensing information is greater than the first sensing information, and control the transmitting coil 4022 to increase the at least one of the capacitance of the capacitor assembly Cp and the inductance of the inductor assembly Lp in response to the second sensing information being not greater than the first sensing information. The second sensing information includes the second sensing voltage value or the second sensing current value. The first sensing information is the first sensing voltage value in response to the second sensing information being the second sensing voltage value. The first sensing information is the first sensing current value in response to the second sensing information being the second sensing current value.

In some embodiments, the controller 404 is also configured to determine whether the second sensing information reaches the preset optimal sensing information in response to the second sensing information being greater than the first sensing information, and control the transmitting coil 4022 to continue to reduce the at least one of the capacitance of the capacitor assembly Cp and the inductance of the inductor assembly Lp in response to the second sensing information does not reaching the optimal sensing information. The optimal sensing information is the optimal sensing voltage value in response to the second sensing information being the second sensing voltage value. The optimal sensing information is the optimal sensing current value in response to the second sensing information being the second sensing current value.

In some embodiments, the controller 404 is also configured to receive the third sensing information sensed from the transmitting coil after controlling the transmitting coil 4022 to increase the at least one of the capacitance of the capacitor assembly Cp and the inductance of the inductor assembly Lp, for example, at the next preset time interval; determine whether the third sensing information is greater than the second sensing information, and control the transmitting coil 4022 to reduce the at least one of the capacitance of the capacitor assembly Cp and the inductance of the inductor assembly Lp in response to the third sensing information being not greater than the second sensing information. The third sensing information includes the third sensing voltage value or the third sensing current value. The second sensing information is the second sensing voltage value in response to the third sensing information being the third sensing voltage value. The second sensing information is the second sensing current value in response to the third sensing information being the third sensing current value.

In some embodiments, the controller 404 is also configured to determine whether the third sensing information reaches the preset optimal sensing information in response to the third sensing information being greater than the second sensing information, and control the transmitting coil 4022 to continue to increase the at least one of the capacitance of the capacitor assembly Cp and the inductance of the inductor assembly Lp in response to the third sensing information not reaching the optimal sensing information. The optimal sensing information is the optimal sensing voltage value in response to the third sensing information being the third sensing voltage value. The optimal sensing information is the optimal sensing current value in response to the third sensing information being the third sensing current value.

Figure 6:
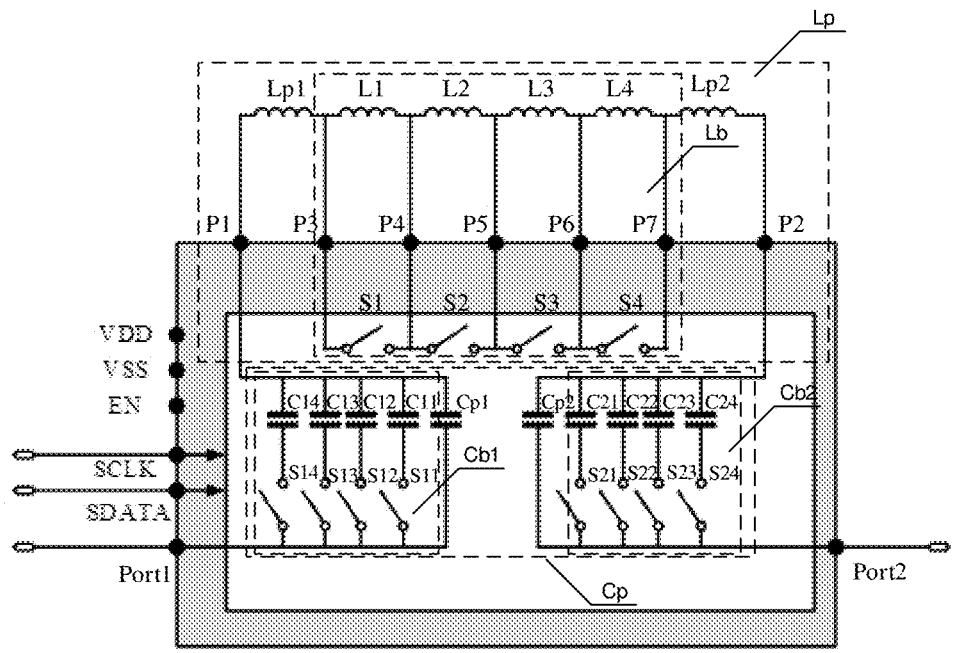
FIG. 6 shows a circuit schematic diagram of a transmission circuit provided by some embodiments.

For example, the transmitting circuit 402 may be encapsulated in a chip. FIG. 6 shows a circuit diagram of the transmission circuit shown according to some embodiments.

As shown in FIG. 6, the capacitor assembly Cp in the transmitting circuit 402 includes a first capacitance Cp1 and a second capacitance Cp2 both connected in series with the inductor assembly Lp, at least one first capacitance branch Cb1 connected in parallel with the first capacitance Cp1 and at least one second capacitance branch Cb2 connected in parallel with the second capacitance Cp2. A plurality of first capacitance branches Cb1 are connected in parallel with each other in response to there being the plurality of first capacitance branches Cb1. A plurality of second capacitance branch Cb2 are connected in parallel with each other in response to there being a plurality of second capacitance branches Cb2. Each first capacitance branch Cb1 includes at least one capacitor $C1x$ ($x=1{\sim}n$) and at least one switch $S1x$ ($x=1{\sim}n$) respectively connected in series with each capacitor $C1x$ ($x=1{\sim}n$). Each second capacitance branch Cb2 includes at least one capacitor $C2x$ ($x=1{\sim}n$) and at least one switch $S2x$ ($x=1{\sim}n$) connected in series with each capacitor $C2x$ ($x=1{\sim}n$), and n is an integer greater than or equal to 1. It should be noted that n=4 is taken as an example in FIG. 6, but the present disclosure is not limited thereto.

The controller 404 can adjust the capacitance of the capacitor assembly Cp by controlling switches S11 to $S1n$ and/or switches S21 to $S2n$.

For example, all capacitors $C11{\sim}C1n$ can be capacitors with equal capacitance. Initially, all switches $S11{\sim}S1n$ are off. Each time one switch from $S11{\sim}S1n$ is turned on, the capacitance of the capacitor assembly Cp can be increased by one capacitance adjustment step above mentioned. On the contrary, for each switch from $S11{\sim}S1n$ turned off, the capacitance of the capacitor assembly Cp can be reduced by one adjustment step above mentioned.

Similarly, all capacitors $C21{\sim}C2n$ can also be capacitors with equal capacitance. Initially, all switches S21 to $S2n$ are off. Each time one switch from S21 to $S2n$ is turned on, the capacitance of the capacitor assembly Cp can be increased by one capacitance adjustment step mentioned above. On the contrary, for each switch from S21 to $S2n$ turned off, the capacitance of the capacitor assembly Cp can be reduced by one capacitance adjustment step above mentioned.

Alternatively, all capacitors $C11{\sim}C1n$ can also be capacitors with different capacities. For example, capacitance of capacitor C11 is c, capacitance of capacitor C12 is 2*C, capacitance of capacitor C13 is 3*C, and so on. Initially, all switches $S11{\sim}S1n$ are off. The capacitance of the capacitor assembly Cp can be increased by one capacitance adjustment step (e.g. capacitance C) in response to the switch S11 corresponding to the capacitor C11 being turned on. The capacitance of the capacitor assembly Cp can continue to increase by one capacitance adjustment step in response to the switch S11 corresponding to the capacitor C11 being turned off and the switch S12 corresponding to the capacitor C12 being turned on. Opposite operations can be performed in response to the capacitance of the capacitor component Cp being reduced.

Similarly, all capacitors C21~C2n can also be capacitors with different capacities. For example, capacitance of capacitor C21 is c, capacitance of capacitor C22 is 2*C, capacitance of capacitor C23 is 3*C, and so on. Initially, all switches S21-S2n are off. The capacitance of the capacitor assembly Cp can be increased by one capacitance adjustment step (e.g. capacitance C) in response to the switch S21 corresponding to the capacitor C21 being turned on. The capacitance of the capacitor assembly Cp can continue to increase by one capacitance adjustment step in response to the switch S11 corresponding to the capacitor C21 being turned off and the switch S22 corresponding to the capacitor C22 being turned on. Opposite operations can be performed in response to the capacitance of the capacitor component Cp being reduced.

In addition, the capacitors C11~C1n in the first capacitance branch Cb1 and the capacitors C21~C2n in the second capacitance branch Cb2 can be controlled independently or jointly, that is, the capacitors C11~C1n and the capacitors C21~C2n symmetrically arranged with the capacitors C11~C1n can be controlled at the same time, for example, the capacitors C11 and C21 are symmetrically arranged, and the capacitors C12 and C22 are symmetrically arranged, and so on. It should be understood by those skilled in the art that in joint control, each time symmetrical capacitors C11~C1n and C21~C2n are controlled, the capacitance of the capacitor assembly Cp can be increased or reduced by one capacitance adjustment step above mentioned.

In addition, in some embodiments, the first capacitor Cp1 can also be connected in series with a switch to form a first capacitance branch Cb1 and/or the second capacitor Cp2 can also be connected in series with a switch to form a second capacitance branch Cb2 respectively, so that, the first capacitor Cp1 and/or the second capacitor Cp2 can also be controlled by controlling each switch in response to adjusting the capacitance of the capacitor assembly Cp.

In addition, in some embodiments, the capacitor assembly Cp may also include only the first capacitor Cp1 and at least one first capacitance branch Cb1, or only the second capacitor Cp2 and at least one second capacitance branch Cb2. In addition, as described above, the first capacitor Cp1 can also be connected in series with a switch to form a first capacitance branch or the second capacitor Cp2 can also be connected in series with a switch to form a second capacitance branch.

For example, the capacitor assembly Cp can be completely encapsulated inside the chip.

It should be understood by those skilled in the art that although the number of the first capacitance branch Cb1 and the number of the second capacitance branch Cb2 are equal in FIG. 6, the present disclosure is not limited thereto, and the number of the first capacitance branch Cb1 may not be equal to the number of the second capacitance branch Cb2. In addition, although in FIG. 6, each first capacitance branch Cb1 is connected in parallel with the first capacitor Cp1, and each second capacitance branch Cb2 is connected in parallel with the second capacitor Cp2. However, it can also be designed that each first capacitance branch Cb1 is connected in series with the first capacitor Cp1, and each second capacitance branch Cb2 is connected in series with the second capacitor Cp2. Under these circumstances, the capacitors C11~C1n in the first capacitance branch Cb1 can be connected in parallel with the corresponding switches S11~S1n, and the capacitors C21~C2n in the second capacitance branch Cb2 can be connected in parallel with the corresponding switches S21-S2n.

As shown in FIG. 6, the inductor assembly Lp in the transmitting circuit 402 includes a first inductor Lp1, a second inductor Lp2 and at least one inductance branch Lb connected in series with the capacitor assembly Cp. Each inductance branch Lb includes at least one inductor Ly (y=1~m) and at least one switch Sy (y=1~m) connected in parallel with the at least one inductor Ly (y=1~m) in one-to-one correspondence, and M is an integer greater than or equal to 1. It should be noted that M=4 is taken as an example in FIG. 6, but the present disclosure is not limited thereto.

The controller 404 can adjust the inductance of the inductor assembly Lp by controlling the at least one switch Sy (y=1~m).

For example, each inductor L1~Lm can be an inductor with equal inductance. Initially, all switches S1~Sm are on. Each time one switch from S1~Sm is turned off, the inductance of the inductor assembly Lp can be increased by one inductance adjustment step above mentioned. On the contrary, for each switch from S1~Sm turned on, the inductance of the inductor assembly Lp can be reduced by one inductance adjustment step above mentioned.

Alternatively, each inductor L1~Lm can also be an inductor with different inductance. For example, inductance of inductor L1 is 1, inductance of inductor L2 is 2*1, inductance of inductor L3 is 3*1, and so on. Initially, all switches S1~Sm are turned on. The inductance of the inductor assembly Lp can be increased by one inductance adjustment step (e.g. inductance L) in response to the switch S1 corresponding to the inductor L1 being turned off. The inductance of the inductor assembly Lp continues to increase by the inductance adjustment step above mentioned in response to the switch S1 corresponding to the inductor L1 being turned on and the switch S2 corresponding to the inductor L2 being turned off. Opposite operations can be performed in response to the inductance of the inductor assembly Lp being reduced.

In addition, in some embodiments, at least one of the first inductor Lp1 and the second inductor Lp2 can also be connected in parallel with a switch to form one or two inductance branches Lb. Thus the at least one of the first inductor Lp1 and the second inductor Lp2 can also be controlled by controlling each switch in response to adjusting the inductance of the inductor assembly Lp.

Each inductor in the inductor assembly Lp is arranged outside the chip to couple with the receiving coil of the wireless receiver.

It should be understood by those skilled in the art that although in FIG. 6, each inductance branch Lb is connected in series with the first inductor Lp1 and the second inductor Lp2. However, it can also be designed that each inductance branch is connected in parallel with the first inductor Lp1 and the second inductor Lp2 respectively. Under these circumstances, the inductors L1~Lm in each inductance branch are connected in series with their corresponding switches S1~Sm.

Figure 7:
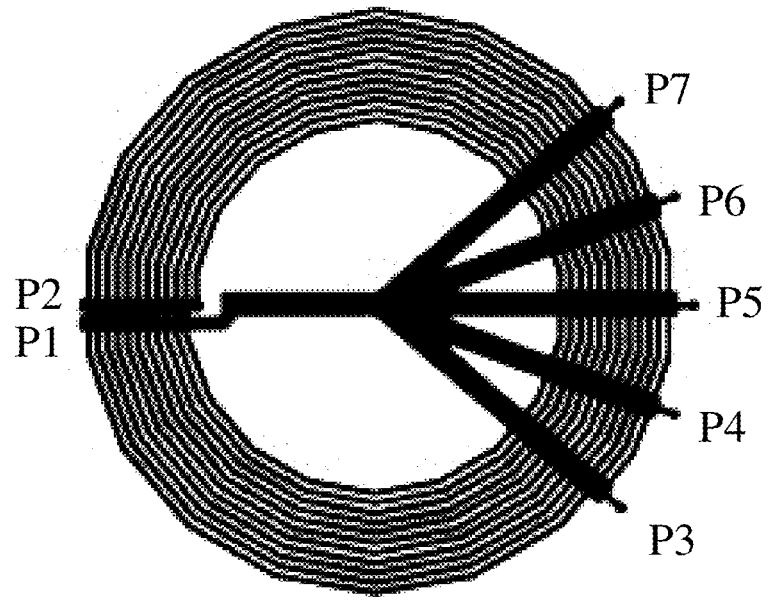
FIG. 7 shows a schematic diagram of an inductor assembly provided by some embodiments.

In practical application, it is very important to physically isolate the transmitting coil and receiving coil from surrounding plane, trace and circuit. This is because these coils generate or receive a significant magnetic field, and the significant magnetic field can be coupled to other metal structures. Therefore, these metal structures must be shielded. Layout of the transmitting coil is shown in FIG. 7. The coil ports P1 and P2 are located on a left side in the figure, and the adjustable coil ports P3 to P7 are located on a right side (coil ports P1 to P7 correspond to ports P1 to P7 in FIG. 6). The coil ports P1 to P7 are controlled by the controller 404 to determine length of the transmitting coil connected to the chip, that is, to adjust the inductance of the inductor assembly Lp. For example, most of the transmitting coil is always connected to the circuit, and adjustable part of the transmitting coil accounts for only about 10%.

In addition, ports port1 and port2 in the chip shown in FIG. 6 are electrically connected with the DC/AC converter 60 in FIG. 5 respectively. Port SCLK and port SDATA are configured to receive control signals of the controller 404 to control each switch.

Figure 8:
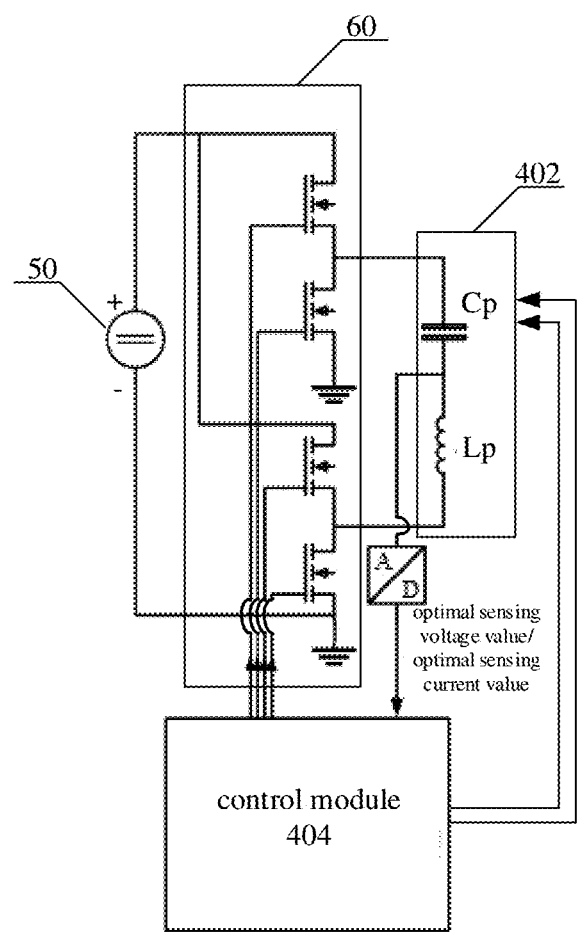
FIG. 8 shows a schematic diagram of a connection among a controller 404 with a DC/AC converter 60 and a transmitting circuit 402 provided by some embodiments.

FIG. 8 shows a schematic diagram of connection between the controller 404, the DC/AC converter 60 and the transmitting circuit 402 provided by an example embodiment. As shown in FIG. 8, the DC/AC converter 60 may be, for example, a full bridge inverter composed of a MOS transistor, and the controller 404 generates pulse signals to control the DC/AC converter 60 to turn on or off at the same time to convert DC supplied by a DC power supply 50 into AC of required frequency. In addition, the controller 404 detects whether current load is capacitor or inductor, determines whether it is necessary to increase or reduce the at least one of the capacitance of the capacitor assembly Cp and the inductance of the inductor assembly Lp, and provides control signals to the transmitting circuit 402 to adjust the capacitor assembly Cp and the inductor assembly Lp as described above.

In addition, the transmitting circuit 402 provides the above feedback voltage value or feedback current value received from the transmitting coil to the controller 404 in response to the wireless transmitter communicating with the wireless receiver through coil coupling.

It should be noted that the block diagram shown in the above drawings is a functional entity and does not necessarily correspond to a physically or logically independent entity. These functional entities may be implemented in software, or in one or more hardware modules or integrated circuits, or in different networks and/or processor apparatuses and/or microcontroller apparatuses.

Figure 9:
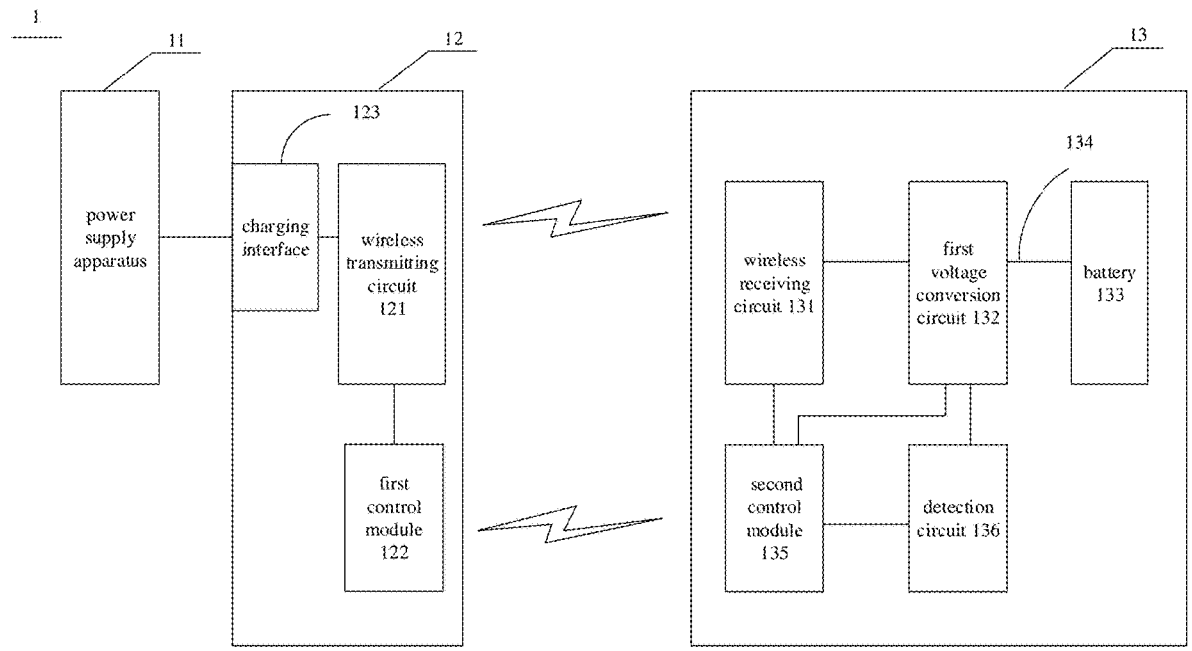
FIG. 9 shows a system structure diagram of a wireless charging system provided by some embodiments.

FIG. 9 shows a system structure diagram of a wireless charging system provided by some embodiments.

As shown in FIG. 9, the wireless charging system 1 includes a power supply apparatus 11, a wireless charging apparatus 12 and an equipment to be charged 13. The power supply apparatus 11 may be, for example, a power adapter, a power bank and other equipments. The wireless charging apparatus 12 may be, for example, a wireless charging base. The equipment to be charged 13 may be, for example, a terminal equipment.

After the power supply apparatus 11 is connected with the wireless charging apparatus 12, an output current is transmitted to the wireless charging apparatus 12.

The wireless charging apparatus 12 includes a wireless transmitting circuit 121 and a first controller 122.

The wireless transmitting circuit 121 is configured to convert electric energy output by the power supply apparatus 11 into electromagnetic signals (or electromagnetic waves) for transmission to wirelessly charge the equipment to be charged 13. For example, the wireless transmitting circuit 121 may include a wireless transmission driving circuit and a transmission coil. The wireless transmission driving circuit is configured to convert DC output by the power supply apparatus 11 into high-frequency AC, and convert the high-frequency AC into electromagnetic signals through the transmission coil.

The first controller 122 may be implemented, for example, by a micro control unit (MCU). The first controller 122 may be configured to wirelessly communicate with the equipment to be charged 13 during wireless charging of the equipment to be charged 13 by the wireless charging apparatus 12. Specifically, the first controller 122 may wirelessly communicate with a second controller 135 in the equipment to be charged 13.

In addition, the wireless charging apparatus 12 includes the power matching apparatus 40 for wireless charging as shown in FIG. 5. The controller 404 in the power matching apparatus 40 may be the first controller 122, that is, the first controller 122 may perform all operations that the controller 404 can perform. The wireless transmitting circuit 121 includes a transmitting circuit 402 in the power matching apparatus 40. That is the wireless transmitting circuit 121 has a transmitting coil with adjustable capacitance and inductance, and can adjust the capacitance and inductance based on the control of the first controller 122 to make the transmitting power of the wireless charging apparatus 12 be matched with the receiving power of the equipment to be charged 13 in response to the wireless charging apparatus 12 wirelessly charging the equipment to be charged 13.

In addition, the wireless charging apparatus 12 may also include a charging interface 123. The wireless transmitting circuit 121 can also be configured to receive the electric energy output by the power supply apparatus 11 through the charging interface 123 and generate electromagnetic signals based on the electric energy output by the power supply apparatus 11.

The charging interface 123 may be, for example, a USB 2.0 interface, a micro USB interface, or a USB type-C interface. In some embodiments, the charging interface 123 may also be a lightning interface, or any other type of parallel port or serial port that can be used for charging.

The wireless charging apparatus 12 can communicate with the power supply apparatus 11. In some embodiments, the wireless charging apparatus 12 can communicate with the power supply apparatus 11 through the charging interface 123 without setting an additional communication interface or other wireless communication module to simplify implementation of the wireless charging apparatus 12. The wireless charging apparatus 12 (or the wireless transmitting circuit 121) and the power supply apparatus 13 can communicate based on data lines (such as D+ and/or D− lines) in the USB interface in response to the charging interface 123 being the USB interface. The wireless charging apparatus 12 (or the wireless transmitting circuit 121) and the power supply apparatus 11 can communicate based on the PD communication protocol in response to the charging interface 123 being a USB interface (such as the USB type-C interface) supporting the power delivery (PD) communication protocol.

In addition, the wireless charging apparatus 12 can also be connected in communication with the power supply apparatus 11 through other communication methods other than the charging interface 123. In some embodiments, the wireless charging apparatus 12 may communicate wirelessly with the power supply apparatus 11, such as near field communication (NFC).

The equipment to be charged 13 may be, for example, a terminal or a communication terminal. The terminal or the communication terminal includes but is not limited to being configured to be connected via a wired line, such as via a public switched telephone network (PSTN), a digital subscriber line (DSL), a digital cable, a direct cable connection and/or another data connection/network, and/or via, for example, a cellular network, a wireless local area network (WLAN), a digital television network such as a digital video broadcasting handheld (DVB-H) network, a satellite network, an amplitude modulation frequency modulation (AM-FM) broadcast transmitter, and/or an apparatus for receiving/transmitting communication signals through a wireless interface of another communication terminal. A communication terminal set to communicate through a wireless interface may be referred to as a "wireless communication terminal", "wireless terminal" and/or a "mobile terminal". Examples of mobile terminals include, but are not limited to, satellite or cellular phones, a personal communication system (PCS) terminal combining cellular radiotelephone with data processing, fax and data communication capabilities, a personal digital assistant (PDA) that may include a radio-telephone, a pager, Internet/intranet access, a web browser, a notepad, a calendar, and/or a global positioning system (GPS) receiver, and a conventional laptop receiver and/or a handheld receiver or other electronic apparatuses including radiotelephone transceivers. In addition, the terminal can also include, but is not limited to, rechargeable electronic apparatuses with charging function, such as e-book readers, intelligent wearable apparatuses, mobile power supplies (such as charging treasure and travel charging), e-cigarettes, wireless mice, wireless keyboards, wireless headphones, Bluetooth speakers, and the like.

The equipment to be charged 13 includes a wireless receiving circuit 131, a battery 133, a first charging channel 134, the second controller 135 and a detection circuit 136.

The wireless receiving circuit 131 is configured to receive the electromagnetic signals transmitted by the wireless transmitting circuit 121 and convert the electromagnetic signals into DC output by the wireless receiving circuit 131. In some embodiments, the wireless receiving circuit 131 may include a receiving coil and a shaping circuit such as a rectifier circuit and/or a filter circuit connected to the receiving coil. The wireless receiving circuit 131 converts the electromagnetic signals transmitted by the wireless transmitting circuit 121 into AC through the receiving coil, and rectifies and/or filters the AC through the shaping circuit to convert the AC into stable DC to charge the battery 133.

It should be noted that the embodiments of the present disclosure does not specifically limit specific forms of the shaping circuit and forms of an output voltage and an output current of the wireless receiving circuit 131 obtained after shaping of the shaping circuit.

In addition, in some embodiments, the equipment to be charged 13 may also include a first voltage conversion circuit 132. The first voltage conversion circuit 132 is arranged on the first charging channel 134 (e.g., a wire) and between the wireless receiving circuit 131 and the battery 133. An expected charging voltage and/or an expected charging current of the battery 133 can be obtained by converting an initial output voltage and/or an initial output current of the wireless receiving circuit 131 through the first voltage conversion circuit 132 in response to the initial output voltage of the wireless receiving circuit 131 cannot meet requirements of the expected charging voltage of the battery 133, and/or the initial output current of the wireless receiving circuit 131 cannot meet requirements of the expected charging current of the battery 133. In some embodiments, the initial output voltage and initial output current of the wireless receiving circuit 131 are input into the first voltage conversion circuit 132 through the first charging channel 134. After the first voltage conversion circuit 132 converts an input voltage, the output voltage and current are loaded at both ends of the battery 133 through the first charging channel 134 to meet the requirements of the expected charging voltage and/or charging current of the battery 133.

The battery 133 may include a single cell or a plurality of cells. The plurality of cells may be in series in response to the battery 133 including the plurality of cells. Thus, a charging voltage that the battery 133 can bear is the sum of charging voltages that the plurality of cells can bear to improve the charging speed and reduce heating caused by charging.

In some embodiments, taking the equipment to be charged 13 as a mobile phone, in response to the battery 133 of the equipment to be charged 13 including the single cell, a voltage of the single cell is generally between 3.0V and 4.35V. A total voltage of two cells in series is 6.0v-8.7V in response to the battery 133 of the equipment to be charged 13 including the two cells in series. Thus, compared with the single cell. The output voltage of the wireless receiving circuit 131 can be improved in response to the plurality of cells being connected in series. Compared with the single cell, to achieve a same charging speed, the charging current required for the plurality of cells is about 1/N of a charging current required for a single cell (N is the number of cells in series in the equipment to be charged 13). In other words, on premise of ensuring the same charging speed (same charging power), a scheme adopting the plurality of cells can reduce the charging current, so as to reduce the heating amount of the equipment 13 to be charged in the charging process. On the other hand, compared with a scheme adopting the single cell, in response to the charging current remaining the same, scheme adopting the plurality of cells series can increase the charging voltage and improve the charging speed.

For example, the second controller 135 may be implemented by an independent MCU, or by an application processor (AP) inside the equipment to be charged 13. The second controller 135 is configured to communicate with the first controller 122 in the wireless charging apparatus 12 and feed back a voltage value and/or a current value detected on the first charging channel 134 (i.e., the above feedback voltage value and/or feedback current value), feedback information such as remaining quantity of electricity of the battery 133 or preset charging time to the wireless charging apparatus 12. In addition, error information and termination transmission information can be fed back to the first controller 122. In addition, the feedback information may also include an adjustment command of the voltage and/or current determined by the equipment to be charged 13 based on the voltage and/or current value detected on the first charging channel 134, the remaining quantity of electricity or the preset charging time.

The detection circuit 136 is configured to detect the voltage value and/or current value on the first charging channel 134. In some embodiments, the voltage value and/or current value on the first charging channel 134 may refer to the voltage value and/or current value between the first voltage conversion circuit 132 and the battery 133 in response to the first voltage conversion circuit 132 being provided in the equipment to be charged 13, that is, the output voltage and/or output current of the first voltage conversion circuit 132 is directly loaded to the battery 133 to charge the battery 133. Alternatively, the voltage value and/or current value on the first charging channel 134 may also refer to the voltage value and/or current value between the wireless receiving circuit 131 and the first voltage conversion circuit 132, that is, the output voltage value and/or current value of the wireless receiving circuit 131.

In some embodiments, the detection circuit 136 may include a voltage detection circuit and a current detection circuit.

The voltage detection circuit is configured to sample the voltage on the first charging channel 134 and transmit a sampled voltage value to the second controller 135. For example, the voltage detection circuit may sample the voltage on the first charging channel 134 by series voltage division.

The current detection circuit is configured to sample the current on the first charging channel 134 and transmit a sampled current value to the second controller 135. For example, the current detection circuit may sample the current on the first charging channel 134, through a current detection resistance and a galvanometer.

After receiving information fed back by the equipment to be charged 13 through the second controller 135, the first controller 122 can adjust the transmitting power of the wireless transmitting circuit 121 based on the voltage value and/or current value on the first charging channel 134, or based on the above voltage and/or current adjustment command to make the voltage and/or current of the DC output by the first charging channel 134 be matched with a charging voltage and/or a charging current required by the battery 133.

It should be understood that the above "the voltage and/or current of the DC output by the first charging channel 134 be matched with a charging voltage and/or a charging current required by the battery 133" includes: the voltage and/or current of the direct current output by the first charging channel 134 is equal to the expected charging voltage and/or current of the battery 133 or floating within a preset range (for example, the voltage value fluctuates up and down 100 mV to 200 mV).

Alternatively, after receiving information fed back by the equipment to be charged 13 through the second controller 135, the first controller 122 can adjust the transmitting power of the wireless transmitting circuit 121 according to the voltage value and/or current value on the first charging channel 134, or according to the above voltage and/or current adjustment command to make the voltage and/or current of the direct current output by the first charging channel 134 meet the charging requirements of the battery 133 in at least one of a trickle charging stage, a constant current charging stage and a constant voltage charging stage.

In addition, as described above, the second controller 135 may also send battery status information to the first controller 122. The battery state information includes at least one of the quantity of electricity and current voltage of the battery 133 in the equipment to be charged 13. After receiving the battery state information, the first controller 122 can first determine a current charging stage of the battery 133 based on the battery state information, and then determine a target output voltage value and/or a target charging current matching the current charging stage of the battery 133, then, the first controller 122 can compare the output voltage and/or output current of the first charging channel 134 sent by the second controller 135 with the determined target output voltage value and/or target charging current of the current charging stage of the battery 133 to determine whether the output voltage and/or output current of the first charging channel 134 is matched with the determined current charging stage of the battery 133. If not, the transmitting power of the wireless transmitting circuit 121 is adjusted until at least one of a feedback output voltage and a feedback output current of first charging channel 134 is matched with the current charging stage of the battery 133.

In addition, as described above, the second controller 135 may directly feed back the detected output voltage and/or output current of the first charging channel 134 to the first controller 122, or may feed back an adjustment command determined according to the detected output voltage and/or output current of the first charging channel 134. The adjustment command may be, for example, a command to increase or decrease the transmitting power of the wireless transmitting circuit 121. Alternatively, the wireless charging apparatus 12 may also set a plurality of gears of the transmitting power for the wireless transmitting circuit 121. Each time the first controller 122 receives the adjustment command, the transmitting power of the wireless transmitting circuit 121 will be adjusted by one gear until the at least one of the feedback output voltage and the feedback output current of first charging channel 134 is matched with the current charging stage of the battery 133.

The present disclosure does not limit the communication mode and communication sequence between the wireless charging apparatus 12 and the equipment to be charged 13 (or the first controller 122 and the second controller 135).

In some embodiments, wireless communication between the wireless charging apparatus 12 and the equipment to be charged 13 (or the first controller 122 and the second controller 135) may be unidirectional wireless communication. Take the equipment to be charged 13 is the initiator of the communication and the wireless charging apparatus 12 is the receiver of the communication in the wireless charging process of the battery 133 as an example. For example, in the constant current charging stage of the battery, the equipment to be charged 13 can detect the charging current of the battery 133 (i.e. the output current of the first charging channel 134) in real time through the detection circuit 13. The equipment to be charged 13 sends feedback information or adjustment information to the wireless charging apparatus 12 to instruct the wireless charging apparatus 12 to adjust the transmitting power of the wireless transmitting circuit 121 in response to the charging current of the battery 133 being not matched the current charging stage.

In some embodiments, the wireless communication between the wireless charging apparatus 12 and the equipment to be charged 13 (or the first controller 122 and the second controller 135) may be bidirectional wireless communication. The bidirectional wireless communication generally requires the receiver to send response information to an initiator after receiving the communication request initiated by the initiator. A bidirectional wireless communication base value can make the communication process more secure. In a process of the bidirectional wireless communication, either of the wireless charging apparatus 12 and the equipment to be charged 13 can initiate a bidirectional communication session as a host equipment, and accordingly, the other of the wireless charging apparatus 12 and the equipment to be charged 13, as a slave equipment, can make a first response or a first reply to communication initiated by the host equipment. Further, the host equipment makes a targeted second response after receiving the first response or the first reply to complete a communication negotiation process between the master and slave equipment.

The targeted second response made by the host equipment after receiving the first response or first reply, includes: the host equipment does not receive the first response or first reply of the slave equipment to the communication session within a preset time, and the host equipment will also make a targeted second response to the first response or first reply of the slave equipment.

In addition, after the slave equipment makes the first response or the first reply to the communication session initiated by the host equipment, it is also possible to complete a communication negotiation process between the host equipment and the slave equipment without the host equipment making a targeted second response to the first response or the first reply of the slave equipment.

During the communication between the wireless charging apparatus 12 and the equipment to be charged 13, the second controller 135 in the equipment to be charged 13 can couple the feedback information to the receiving coil of the wireless receiving circuit 131 and send the feedback information to the first controller 122 of the wireless charging apparatus 12.

Alternatively, the equipment to be charged 13 can also communicate through at least one of the communication modes such as Bluetooth, WiFi, mobile cellular network (such as 2G, 3G, 4G or 5g), wireless communication (such as LEEE 802.11, 802.15 (WPANs), 802.16 (WiMAX), 802.20, etc.), short-range wireless communication based on high-frequency antenna (such as 60 GHz), optical communication (such as infrared communication), ultrasonic communication and ultra wideband (UMB) communication communicates with the wireless charging apparatus 12 to transmit the above feedback information to the wireless charging apparatus 12. It can be understood that in response to communicating through the above communication mode, the equipment to be charged 13 and the wireless charging apparatus 12 also include corresponding communication modules, such as at least one of a Bluetooth communication module, a WiFi communication module, a 2G/3G/4G/5G mobile communication module, a high-frequency antenna, an optical communication module, an ultrasonic communication module, an ultra wideband communication module, and the like. It should be understood that the above standards that can be adopted for wireless communication include previous and existing standards, and future versions and future standards adopting these standards without departing from the scope of the present disclosure. By communicating through the above wireless communication mode, reliability of communication can be improved, so as to improve the charging safety. Compared with a method of coupling the feedback information to the receiving coil of the wireless receiving circuit 131 through signal modulation in the related technology (e.g., Qi standard), by communicating through the above wireless communication mode, the reliability of communication can be improved, and voltage ripple caused by signal coupling communication can be avoided which affects a voltage processing process of the first voltage conversion circuit 132 of the equipment to be charged 13. In addition, for voltage ripple at the output of the wireless receiving coil, if the ripple is not effectively treated, the ripple may lead to safety problems of wireless charging, and there are certain potential safety hazards. By communicating through the above wireless communication mode, the voltage ripple can be eliminated. Thus a circuit for processing the voltage ripple can be omitted, complexity of the charging circuit of the equipment to be charged 13 can be reduced, the charging efficiency can be improved, circuit setting space can be saved and cost can be reduced.

The power supply apparatus 11 may be a power supply apparatus with fixed output power or a power supply apparatus with adjustable output power. A voltage feedback loop and a current feedback loop can be set inside the power supply apparatus with adjustable output power, so that the output voltage and/or output current can be adjusted according to the actual needs.

As described above, the wireless charging apparatus 12 can continuously adjust the transmitting power of the wireless transmitting circuit 121 during charging to make the at least one of the output voltage and output current of the first charging channel 134 be matched with the current charging stage of the battery 133.

In some embodiments, the first controller 122 may adjust the amount of power extracted by the wireless transmitting circuit 121 from maximum output power provided by the power supply apparatus 11, thereby adjusting the transmitting power of the wireless transmitting circuit 121. That is, control right of the transmitting power adjustment of the wireless transmitting circuit 121 is assigned to the first controller 122. The first controller 122 can adjust the transmitting power of the wireless transmitting circuit 121 by adjusting the amount of power extracted from the maximum output power after receiving the feedback information of the equipment to be charged 13, which has the advantages of fast adjustment speed and high efficiency.

In some embodiments, a power adjustment circuit may be provided inside the first controller 122, inside the wireless transmitting circuit 121, or between the first controller 122 and the wireless transmitting circuit 121. In some embodiments, the power adjustment circuit may include a pulse width modulation (PWM) controller and a switching unit. The first controller 122 may adjust the transmitting power of the wireless transmitting circuit 121 by adjusting duty cycle of control signals sent by the PWM controller and/or by controlling switching frequency of the switching unit.

Alternatively, in other embodiments, the first controller 122 may adjust the output voltage and/or output current of the power supply apparatus 11 by communicating with the power supply apparatus 11, thereby adjusting the transmitting power of the wireless transmitting circuit 121. That is, the control right of the transmitting power adjustment of the wireless transmitting circuit 121 is assigned to the power supply apparatus 11, and the power supply apparatus 11 adjusts the transmitting power of the wireless transmitting circuit 121 by changing the output voltage and/or output current. The advantage of the adjustment method is that the power supply apparatus 11 provides as much power as the wireless charging apparatus 12 needs, and there is no waste of power.

It should be understood that, similar to the communication mode between the wireless charging apparatus 12 and the equipment to be charged 13, communication between the wireless charging apparatus 12 (or the first controller 122) and the power supply apparatus 11 can be unidirectional wireless communication or bidirectional wireless communication. The present disclosure is not specifically limited thereto.

Figure 10:
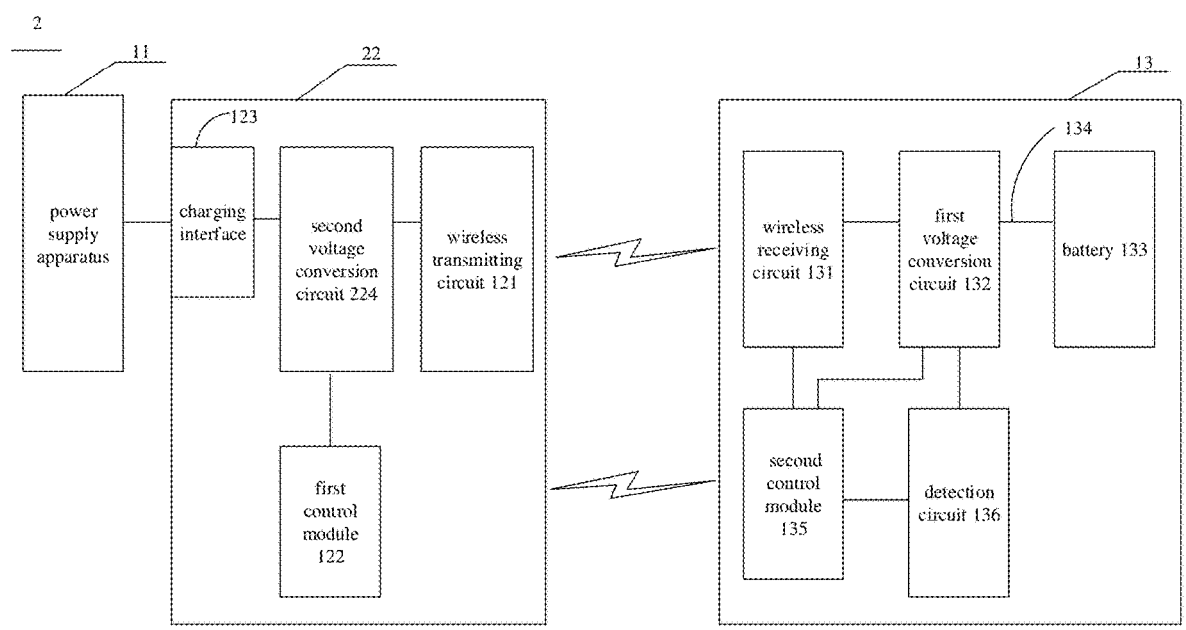
FIG. 10 shows a system structure diagram of another wireless charging system shown provided by some embodiments.

FIG. 10 shows a system structure diagram of another wireless charging system shown provided by another exemplary embodiment.

As shown in FIG. 10, difference from the wireless charging system 1 shown in FIG. 9 is that the wireless charging apparatus 22 in the wireless charging system 2 also includes a second voltage conversion circuit 224. The second voltage conversion circuit 224 is arranged between the charging interface 123 and the wireless transmitting circuit 121 and can be configured to receive the output voltage and output current of the power supply apparatus 11. The wireless transmitting circuit 121 is configured to generate electromagnetic signals (or electromagnetic wave) based on the voltage and current converted by the second voltage conversion circuit 224.

A method of the first controller 122 adjusts the transmitting power of the wireless transmitting circuit 121 may include: the first controller 122 adjusts the voltage and/or current converted by the second voltage conversion circuit 224 to adjust the transmitting power of the wireless transmitting circuit 121.

The first controller can adjust the output voltage and/or output current of the second voltage conversion circuit 224 to adjust the transmitting power of the wireless transmitting circuit 121 in response to the power supply apparatus 11 being a power supply apparatus with a fixed output power, thereby improving universality of the wireless charging apparatus 22 to apply to an existing ordinary power supply apparatus 11. In some embodiments, the second voltage conversion circuit 224 may include a PWM controller and a switching unit. The first controller may adjust the transmitting power of the wireless transmitting circuit 121 by adjusting the duty cycle of the control signal sent by the PWM controller and/or adjusting the output voltage and/or output current of the second voltage conversion circuit 224 by controlling the switching frequency of the switching unit.

Alternatively, in some embodiments, the second voltage conversion circuit 224 may receive the output voltage and output current of the power supply apparatus 11 through the charging interface 123. In some embodiments, the wireless charging apparatus 22 is connected with an ordinary power supply apparatus through the charging interface 123 in response to the power supply apparatus 11 being an ordinary power supply apparatus. During wireless charging, the first controller 122 can control the second voltage conversion circuit 224 to start working, and adjust the output voltage and/or output current of the second voltage conversion circuit 224 according to the feedback information of the equipment to be charged 13, so that the transmitting power of the wireless transmitting circuit 121 meets the charging requirements of the current battery 133. The adjustment method also assigns the control right of the transmitting power adjustment of the wireless transmitting circuit 121 to the first controller 122. The first controller 122 can adjust the transmitting power of the wireless transmitting circuit 121 immediately after receiving the feedback information of the equipment to be charged 13, which has the advantages of fast adjustment speed and high efficiency.

It should also be understood that the output current of the power supply apparatus 11 can be constant DC, pulsating DC or AC. The present disclosure is not limited thereto.

The above description takes the wireless charging apparatus 12 or 22 connected with the power supply apparatus 11 to obtain electric energy from the power supply apparatus 11 as an example, but the present disclosure is not limited to this. The wireless charging apparatus 12 or 22 can also integrate functions similar to the adapter inside the wireless charging apparatus 12 or 22, thereby directly converting a externally input AC (such as city electricity) into the above electromagnetic signals (or electromagnetic wave). In some embodiments, the functions of the adapter may be integrated in the wireless transmitting circuit 121 of the wireless charging apparatus 12 or 22. In some embodiments, the rectifier circuit, the primary filter circuit, the transformer, and the like may be integrated in the wireless transmitting circuit 121. In this way, the wireless transmitting circuit 121 can be configured to receive an external input AC (such as 220V AC, or city electricity), and generate electromagnetic signals (or electromagnetic wave) according to the AC. Integrating functions similar to the adapter in the wireless charging apparatus 12 or 22 can make the wireless charging apparatus 12 or 22 do not need to obtain power from an external power supply apparatus, improve integration of the wireless charging apparatus 12 or 22, and reduce the number of apparatuses required to realize the wireless charging process.

In addition, the above power supply apparatus 11 includes a fast charging type power supply apparatus and a common type power supply apparatus. Maximum output power provided by the fast charging type power supply apparatus is greater than or equal to a preset value. Maximum output power provided by the common type power supply apparatus is less than the preset value. It should be understood that in the embodiments of the present application, the fast charging type power supply apparatus and the ordinary type power supply apparatus are classified only by the maximum output power, and other characteristics of the power supply apparatus are not distinguished. That is, the fast charging type power supply apparatus and the ordinary type power supply apparatus can be equivalent to the first type power supply apparatus and the second type power supply apparatus respectively. In some embodiments, a power supply apparatus with a maximum output power greater than or equal to 20 W can be classified as a fast charging type power supply apparatus, and a power supply apparatus with a maximum output power less than 20 W can be classified as a common type power supply apparatus.

Accordingly, the wireless charging apparatus 12 or 22 can support the first wireless charging mode and the second wireless charging mode. A charging speed of the wireless charging apparatus 12 or 22 to the equipment to be charged 13 in the first wireless charging mode is faster than a charging speed of the wireless charging apparatus 12 or 22 to the equipment to be charged 13 in the second wireless charging mode. In other words, compared with the wireless charging apparatus 12 or 22 working in the second wireless charging mode, the wireless charging apparatus 12 or 22 working in the first wireless charging mode takes less time to fill the battery in the equipment to be charged 13 with the same capacitance.

The first wireless charging mode may be a fast wireless charging mode. The fast wireless charging mode may refer to a wireless charging mode in which the transmitting power of the wireless charging apparatus 12 or 22 is large (usually greater than or equal to 15 W).

The second wireless charging mode may be the ordinary wireless charging mode. The ordinary wireless charging mode may refer to a wireless charging mode in which the transmitting power of the wireless charging apparatus 12 or 22 is small (usually less than 15 W, and the common transmitting power is 5 W or 10 W). In some embodiments, the ordinary wireless charging mode may be a traditional wireless charging mode based on Qi standard, PMA standard or A4WP standard.

In the ordinary wireless charging mode, it usually takes several hours to fully fill a large capacitance battery (such as a battery with capacitance of 3000 MAH). However, in the fast wireless charging mode, due to the faster charging speed, the charging time required to fully fill the battery with the same capacitance can be significantly shortened.

In some embodiments, the first controller 122 performs bidirectional wireless communication with the second controller 135 to control the transmitting power of the wireless transmitting circuit 121 in the first wireless charging mode.

In some embodiments, a process that the first controller 122 performs bidirectional wireless communication with the second controller 135 to control the transmitting power of the wireless transmitting circuit 121 in the first wireless charging mode may include: the first controller 122 performs bidirectional communication with the second controller 135 to negotiate the wireless charging mode between the wireless charging apparatus 12 or 22 and the equipment to be charged 13.

In some embodiments, the first controller 122 performs handshake communication with the second controller 135. The wireless charging apparatus 12 or 22 is controlled to charge the equipment to be charged 13 using the first wireless charging mode in response to the handshake communication being successful. The wireless charging apparatus 12 or 22 is controlled to charge the equipment to be charged 13 using the second wireless charging mode. in response to the handshake communication failing.

The handshake communication can refer to identification of each other's identity by both parties of the communication. Successful handshake communication can indicate that both the wireless charging apparatus 12 or 22 and the equipment to be charged 13 support a wireless charging mode with adjustable transmitting power. Failing handshake communication may indicate that at least one of the wireless charging apparatus 12 or 22 and the equipment to be charged 13 does not support the wireless charging mode with adjustable transmitting power.

In the present disclosure, the wireless charging apparatus 12 or 22 does not blindly adopt the first wireless charging mode for fast wireless charging of the equipment to be charged 13, but performs bidirectional communication with the equipment to be charged 13 to negotiate whether the wireless charging apparatus 12 or 22 can adopt the first wireless charging mode for fast wireless charging of the equipment to be charged 13, thereby improving safety of the charging process.

In some embodiments, a method that the first controller 122 and the second controller 135 perform bidirectional communication to negotiate the wireless charging mode between the wireless charging apparatus 12 or 22 and the equipment to be charged 13 includes the following operations. The first controller 122 may send a first command to the second controller 135, and the first command is configured to ask whether the equipment to be charged 13 turns on the first wireless charging mode. The first controller 122 receives a reply command to the first command sent by the second controller 135, and the reply command is configured to indicate whether the equipment to be charged 13 agrees to turn on the first wireless charging mode. The first controller controls the wireless charging apparatus 12 or 22 to charge the equipment to be charged 13 using the first wireless charging mode in response to the equipment to be charged 13 agreeing to turn on the first wireless charging mode.

In addition to determining the wireless charging mode based on communication negotiation, the first controller 122 can also select or switch the wireless charging mode based on some other factors. In some embodiments, the first controller 122 can also control the wireless charging apparatus 12 or 22 to use the first wireless charging mode or the second wireless charging mode to charge the battery 133 based on temperature of the battery 133. In some embodiments, the first controller 122 can control the wireless charging apparatus 12 or 22 to use the second wireless charging mode for ordinary charging in response to the temperature being lower than a preset low-temperature threshold (such as 5° C. or 10° C.). The first controller 122 can control the wireless charging apparatus 12 or 22 to use the first wireless charging mode for fast charging in response to the temperature being greater than or equal to the preset low-temperature threshold. Further, in response to the temperature being higher than to high temperature threshold (e.g., 50° C.), the first controller 122 can control the wireless charging apparatus 12 or 22 to stop charging.

Embodiments of the present disclosure are specifically shown and described above. It should be understood that the present disclosure is not limited to the detailed structure, setting mode or implementation method described herein. On the contrary, the present disclosure is intended to cover various modifications and equivalent settings contained within the spirit and scope of the appended claims.

What is claimed is:

1. A power matching apparatus for wireless charging, for a wireless transmitter, comprising:
   a transmitting coil, comprising at least one of a capacitor assembly with adjustable capacitance and an inductor assembly with adjustable inductance; and
   a controller electrically connected with the transmitting coil and being configured to receive first sensing information sensed from the transmitting coil, detect whether resonant frequency has changed according to the first sensing information, and adjust at least one of capacitance of the capacitor assembly with adjustable capacitance and inductance of the inductor assembly with adjustable inductance to make transmitting power of the wireless transmitter be matched with receiving power of a wireless receiver in response to the resonant frequency being changed, wherein the first sensing information comprises a first sensing voltage value or a first sensing current value;
   wherein the controller is configured to determine whether the first sensing information is less than a preset feedback information threshold, and determine that the resonant frequency has changed in response to the first sensing information being less than the preset feedback information threshold, the preset feedback information threshold is a voltage threshold in response to the first sensing information being the first sensing voltage value, and the preset feedback information threshold is a current threshold in response to the first sensing information being the first sensing current value;
   wherein the controller is configured to determine whether the first sensing information is less than a preset feedback information threshold, and determine that the resonant frequency has changed in response to the first sensing information being less than the preset feedback information threshold, the preset feedback information threshold is a voltage threshold in response to the first sensing information being the first sensing voltage value, and the preset feedback information threshold is a current threshold in response to the first sensing information being the first sensing current value.

2. The apparatus as claimed in claim 1, wherein the inductor assembly with adjustable inductance comprises at least one inductance branch, all inductance branches are connected in series with each other in response to the number of the at least one inductance branch being more than one, and each inductance branch comprises an inductor and a switch connected in parallel with the inductor.

3. The apparatus as claimed in claim 1, wherein the capacitor assembly with adjustable capacitance comprises at least one first capacitance branch and/or at least one second capacitance branch, the at least one first capacitance branch is connected in series with the at least one second capacitance branch in response to the capacitor assembly comprising the at least one first capacitance branch and the at least one second capacitance branch, all first capacitance branches are connected in parallel with each other, and all second capacitance branches are connected in parallel with each other, and each of the at least one first capacitance branch and the at least one second capacitance branch includes a capacitor and a switch connected in series with the capacitor.

4. The apparatus as claimed in claim 1, wherein the controller is configured to control the transmitting coil to increase or reduce the at least one of the capacitance of the capacitor assembly and the inductance of the inductor assembly in response to the resonant frequency changing.

5. The apparatus as claimed in claim 4, wherein the controller is further configured to receive second sensing information sensed from the transmitting coil after controlling the transmitting coil to increase the at least one of the capacitance of the capacitor assembly and the inductance of the inductor assembly, determine whether the second sensing information is greater than the first sensing information, and control the transmitting coil to reduce the at least one of the capacitance of the capacitor assembly and the inductance of the inductor assembly in response to the second sensing information being not greater than the first sensing information, and the second sensing information comprises: a second sensing voltage value or a second sensing current value; the first sensing information is the first sensing voltage value in response to the second sensing information being the second sensing voltage value, and the first sensing information is the first sensing current value in response to the second sensing information being the second sensing current value; and
    wherein the controller is further configured to receive fourth sensing information sensed from the transmitting coil after controlling the transmitting coil to reduce the at least one of the capacitance of the capacitor assembly and the inductance of the inductor assembly, determine whether the fourth sensing information is greater than the first sensing information, and control the transmitting coil to increase the at least one of the capacitance of the capacitor assembly and the inductance of the inductor assembly in response to the fourth sensing information being not greater than the first sensing information; the fourth sensing information comprises: a fourth sensing voltage value or a fourth sensing current value, the first sensing information is the first sensing voltage value in response to the fourth sensing information being the fourth sensing voltage value, and the first sensing information is the first sensing current value in response to the fourth sensing information being the fourth sensing current value.

6. The apparatus as claimed in claim 5, wherein the controller is further configured to determine whether the second sensing information reaches a first preset optimal sensing information in response to the second sensing information being greater than the first sensing information; and control the transmitting coil to continue to increase the at least one of the capacitance of the capacitor assembly and the inductance of the inductor assembly in response to the second sensing information not reaching the first preset optimal sensing information, the first preset optimal sensing information is a first optimal sensing voltage value in response to the second sensing information being the second sensing voltage value, the first optimal sensing information is a first optimal sensing current value in response to the second sensing information being the second sensing current value; and
    wherein the controller is further configured to determine whether the fourth sensing information reaches a second preset optimal sensing information in response to the fourth sensing information being greater than the first sensing information, and control the transmitting coil to continue to reduce the at least one of the capacitance of the capacitor assembly and the inductance of the inductor assembly in response to the fourth sensing information not reaching the second preset optimal sensing information, the second preset optimal sensing information is a second optimal sensing voltage value in response to the fourth sensing information being the fourth sensing voltage value, and the second optimal sensing information is a second optimal sensing current value in response to the fourth sensing information being the fourth sensing current value.

7. The apparatus as claimed in claim 6, wherein the controller is further configured to receive third sensing information sensed from the transmitting coil after controlling the transmitting coil to reduce the at least one of the capacitance of the capacitor assembly and the inductance of the inductor assembly, determine whether the third sensing information is greater than the second sensing information, and control the transmitting coil to increase the at least one of the capacitance of the capacitor assembly and the inductance of the inductor assembly in response to the third sensing information being not greater than the second sensing information, the second sensing information is the second sensing voltage value in response to the third sensing information being a third sensing voltage value, the second sensing information is the second sensing current value in response to the third sensing information being a third sensing current value; and
    wherein the controller is further configured to receive fifth sensing information sensed from the transmitting coil after controlling the transmitting coil to increase the at least one of the capacitance of the capacitor assembly and the inductance of the inductor assembly, determine whether the fifth sensing information is greater than the fourth sensing information, and control the transmitting coil to reduce the at least one of the capacitance of the capacitor assembly and the inductance of the inductor assembly in response to the fifth sensing information being not greater than the second sensing information; the fifth sensing information comprises a fifth sensing voltage value or a fifth sensing current value, the fourth sensing information is the fourth sensing voltage value in response to the fifth sensing information being the fifth sensing voltage value, and the fourth sensing information is the fourth sensing current value in response to the fifth sensing information being the fifth sensing current value.

8. The apparatus as claimed in claim 7, wherein the controller is further configured to determine whether the third sensing information reaches the first preset optimal sensing information in response to the third sensing information being greater than the second sensing information; and control the transmitting coil to continue to reduce the at least one of the capacitance of the capacitor assembly and the inductance of the inductor assembly in response to the third sensing information not reaching the first preset optimal sensing information; the first preset optimal sensing information is the first optimal sensing voltage value in response to the third sensing information being the third sensing voltage value, the first preset optimal sensing information is the first optimal sensing current value in response to the third sensing information being the third sensing current value; and
    wherein the controller is further configured to determine whether the fifth sensing information reaches the second preset optimal sensing information in response to the fifth sensing information being greater than the fourth sensing information, and control the transmitting coil to continue to increase the at least one of the capacitance of the capacitor assembly and the inductance of the inductor assembly in response to the fifth sensing information not reaching the second preset optimal sensing information, the second preset optimal sensing information is the second optimal sensing voltage value in response to the fifth sensing information being the fifth sensing voltage value, and the second preset optimal sensing information is the second optimal sensing current value in response to the fifth sensing information being the fifth sensing current value.

9. A power matching method for wireless charging, for a wireless transmitter in a wireless charging system, wherein a transmitting coil of the wireless transmitter comprises a capacitor assembly with adjustable capacitance and/or an inductor assembly with adjustable inductance, and the method comprises:
receiving first sensing information sensed from the transmitting coil;
detecting whether resonant frequency has changed according to the first sensing information; and
adjusting at least one of capacitance of the capacitor assembly in the transmitting coil of the wireless transmitter and inductance of the inductor assembly in the transmitting coil in response to the resonant frequency changing to make transmitting power of the wireless transmitter be matched with receiving power of a wireless receiver in the wireless charging system;
wherein the first sensing information comprises at least one of a first sensing voltage value and a first sensing current value;
wherein the detecting whether the resonant frequency has changed according to the first sensing information comprises:
determining whether the first sensing information is less than a preset feedback information threshold; and
determining that the resonant frequency has changed in response to the first sensing information being less than the preset feedback information threshold;
wherein the preset feedback information threshold is a voltage threshold in response to the first sensing information being the first sensing voltage value, and the preset feedback information threshold is a current threshold in response to the first sensing information being the first sensing current value.

10. The method as claimed in claim 9, wherein the adjusting the at least one of the capacitance of the capacitor assembly in the transmitting coil of the wireless transmitter and the inductance of the inductor assembly in the transmitting coil comprises increasing or reducing the at least one of the capacitance of the capacitor assembly in the transmitting coil and the inductance of the inductor assembly in the transmitting coil.

11. The method as claimed in claim 10, wherein the adjusting the at least one of the capacitance of the capacitor assembly in the transmitting coil of the wireless transmitter and the inductance of the inductor assembly in the transmitting coil further comprises: after increasing the at least one of the capacitance of the capacitor assembly in the transmitting coil and the inductance of the inductor assembly in the transmitting coil,
receiving second sensing information sensed from the transmitting coil;
determining whether the second sensing information is greater than the first sensing information; and
reducing the at least one of the capacitance of the capacitor assembly in the transmitting coil and the inductance of the inductor assembly in the transmitting coil in response to the second sensing information being not greater than the first sensing information;
wherein the second sensing information comprises: a second sensing voltage value or a second sensing current value, the first sensing information is the first sensing voltage value in response to the second sensing information being the second sensing voltage value, and the first sensing information is the first sensing current value in response to the second sensing information being the second sensing current value; or
wherein the adjusting the at least one of the capacitance of the capacitor assembly in the transmitting coil of the wireless transmitter and the inductance of the inductor assembly in the transmitting coil further comprises: after reducing the at least one of the capacitance of the capacitor assembly in the transmitting coil and the inductance of the inductor assembly in the transmitting coil,
receiving fourth sensing information sensed from the transmitting coil;
determining whether the fourth sensing information is greater than the first sensing information; and
increasing the at least one of the capacitance of the capacitor assembly in the transmitting coil and the inductance of the inductor assembly in the transmitting coil in response to the fourth sensing information being not greater than the first sensing information;
wherein the second sensing information comprises: a fourth sensing voltage value or a fourth sensing current value, the first sensing information is the first sensing voltage value in response to the fourth sensing information being the fourth sensing voltage value, and the first sensing information is the first sensing current value in response to the fourth sensing information being the fourth sensing current value.

12. The method as claimed in claim 11, wherein the adjusting the at least one of the capacitance of the capacitor assembly in the transmitting coil of the wireless transmitter and the inductance of the inductor assembly in the transmitting coil further comprises:
determining whether the second sensing information reaches a first preset optimal sensing information in response to the second sensing information being greater than the first sensing information; and
continuing to increase the at least one of the capacitance of the capacitor assembly in the transmitting coil and the inductance of the inductor assembly in the transmitting coil in response to the second sensing information not reaching the first preset optimal sensing information;
wherein the first preset optimal sensing information is a first optimal sensing voltage value in response to the second sensing information being the second sensing voltage value, and the first preset optimal sensing information is a first optimal sensing current value in response to the second sensing information is the second sensing current value; or
wherein the adjusting the at least one of the capacitance of the capacitor assembly in the transmitting coil of the wireless transmitter and the inductance of the inductor assembly in the transmitting coil further comprises:

determining whether the fourth sensing information reaches a second preset optimal sensing information in response to the fourth sensing information being greater than the first sensing information; and continuing to reduce the at least one of the capacitance of the capacitor assembly in the transmitting coil and the inductance of the inductor assembly in the transmitting coil in response to the fourth sensing information not reaching the second preset optimal sensing information;

wherein the second preset optimal sensing information is a second optimal sensing voltage value in response to the fourth sensing information being the fourth sensing voltage value, and the second preset optimal sensing information is a second optimal sensing current value in response to the fourth sensing information being the fourth sensing current value.

13. The method as claimed in claim 12, wherein the adjusting the at least one of the capacitance of the capacitor assembly in the transmitting coil of the wireless transmitter and the inductance of the inductor assembly in the transmitting coil further comprises: after reducing the at least one of the capacitance of the capacitor assembly in the transmitting coil and the inductance of the inductor in the transmitting coil, receiving third sensing information sensed from the transmitting coil;

determining whether the third sensing information is greater than the second sensing information; and increasing the at least one of the capacitance of the capacitor assembly in the transmitting coil and the inductance of the inductor in the transmitting coil in response to the third sensing information being not greater than the second sensing information;

wherein the third sensing information comprises: a third sensing voltage value or a third sensing current value, the second sensing information is the second sensing voltage value in response to the third sensing information being the third sensing voltage value, and the second sensing information is the second sensing current value in response to the third sensing information being the third sensing current value; or wherein the adjusting the at least one of the capacitance of the capacitor assembly in the transmitting coil at the wireless transmitter and the inductance of the inductor assembly in the transmitting coil further comprises: after increasing the at least one of the capacitance of the capacitor assembly in the transmitting coil and the inductance of the inductor assembly in the transmitting coil, receiving fifth sensing information sensed from the transmitting coil;

determining whether the fifth sensing information is greater than the fourth sensing information; and reducing the at least one of the capacitance of the capacitor assembly in the transmitting coil and the inductance of the inductor in the transmitting coil in response to the fifth sensing information being not greater than the fourth sensing information;

wherein the fifth sensing information comprises: a fifth sensing voltage value or a fifth sensing current value, the fourth sensing information is the fourth sensing voltage value in response to the fifth sensing information being the fifth sensing voltage value, and the fourth sensing information is the fourth sensing current value in response to the fifth sensing information being the fifth sensing current value.

14. The method as claimed in claim 13, wherein the adjusting the at least one of the capacitance of the capacitor assembly in the transmitting coil of the wireless transmitter and the inductance of the inductor in the transmitting coil further comprises:

determining whether the third sensing information reaches the first preset optimal sensing information in response to the third sensing information being greater than the second sensing information; and continuing to reduce the at least one of the capacitance of the capacitor assembly in the transmitting coil and the inductance of the inductor in the transmitting coil in response to the third sensing information not reaching the first preset optimal sensing information;

wherein the optimal sensing information is the first optimal sensing voltage value in response to the third sensing information being the third sensing voltage value, and the first preset optimal sensing information is the first optimal sensing current value in response to the third sensing information being the third sensing current value; or wherein the adjusting the at least one of the capacitance of the capacitor assembly in the transmitting coil of the wireless transmitter and the inductance of the inductor in the transmitting coil further comprises:

determining whether the fifth sensing information reaches the second preset optimal sensing information in response to the fifth sensing information being greater than the fourth sensing information; and continuing to increase the at least one of the capacitance of the capacitor assembly in the transmitting coil and the inductance of the inductor in the transmitting coil in response to the fifth sensing information not reaching the second preset optimal sensing information;

wherein the second preset optimal sensing information is the second optimal sensing voltage value in response to the fifth sensing information being the fifth sensing voltage value, and the second preset optimal sensing information is the second optimal sensing current value in response to the fifth sensing information being the fifth sensing current value.

15. A wireless charging apparatus, comprising a power matching apparatus for wireless charging, wherein the power matching apparatus for wireless charging is for a wireless transmitter and comprises:

a transmitting coil, comprising at least one of a capacitor assembly with adjustable capacitance and an inductor assembly with adjustable inductance; and a controller electrically connected with the transmitting coil and being configured to receive first sensing information sensed from the transmitting coil, detect whether resonant frequency has changed according to the first sensing information, and adjust at least one of capacitance of the capacitor assembly with adjustable capacitance and inductance of the inductor assembly with adjustable inductance to make transmitting power of the wireless transmitter be matched with receiving power of a wireless receiver in response to the resonant frequency being changed, wherein the first sensing information comprises a first sensing voltage value or a first sensing current value;

wherein the controller is configured to determine whether the first sensing information is less than a preset feedback information threshold, and determine that the resonant frequency has changed in response to the first sensing information being less than the preset feedback information threshold, the preset feedback information threshold is a voltage threshold in response to the first sensing information being the first sensing voltage value, and the preset feedback information threshold is a current threshold in response to the first sensing information being the first sensing current value.

16. The wireless charging apparatus as claimed in claim 15, wherein the inductor assembly with adjustable inductance comprises at least one inductance branch, all inductance branches are connected in series with each other in response to the number of the at least one inductance branch being more than one, and each inductance branch comprises an inductor and a switch connected in parallel with the inductor.

17. The wireless charging apparatus as claimed in claim 15, wherein the capacitor assembly with adjustable capacitance comprises at least one first capacitance branch and/or at least one second capacitance branch, the at least one first capacitance branch is connected in series with the at least one second capacitance branch in response to the capacitor assembly comprising the at least one first capacitance branch and the at least one second capacitance branch, all first capacitance branches are connected in parallel with each other, and all second capacitance branches are connected in parallel with each other, and each of the at least one first capacitance branch and the at least one second capacitance branch includes a capacitor and a switch connected in series with the capacitor.

* * * * *